US011950381B2

(12) United States Patent
Zhou et al.

(10) Patent No.: US 11,950,381 B2
(45) Date of Patent: Apr. 2, 2024

(54) INTERACTIVE INFORMATION TERMINAL WITH VARIABLE FORM

(71) Applicants: GUANGZHOU SHIRUI ELECTRONICS CO., LTD., Guangdong (CN); GUANGZHOU SHIYUAN ELECTRONICS CO., LTD., Guangdong (CN)

(72) Inventors: Kesong Zhou, Guangdong (CN); Zhicheng Peng, Guangdong (CN)

(73) Assignees: GUANGZHOU SHIRUI ELECTRONICS CO., LTD., Guangzhou (CN); GUANGZHOU SHIYUAN ELECTRONIC TECHNOLOGY COMPANY LIMITED, Guangzhou (CN)

( * ) Notice: Subject to any disclaimer, the term of this patent is extended or adjusted under 35 U.S.C. 154(b) by 264 days.

(21) Appl. No.: 17/383,673

(22) Filed: Jul. 23, 2021

(65) Prior Publication Data

US 2021/0352811 A1   Nov. 11, 2021

Related U.S. Application Data

(63) Continuation of application No. PCT/CN2019/126315, filed on Dec. 18, 2019.

(30) Foreign Application Priority Data

Jan. 25, 2019   (CN) .......................... 201920141703.4

(51) Int. Cl.
*H05K 5/02*     (2006.01)
*H05K 5/03*     (2006.01)
(Continued)

(52) U.S. Cl.
CPC ......... *H05K 5/0204* (2013.01); *H05K 5/0286* (2013.01); *H05K 5/03* (2013.01); *F16M 11/10* (2013.01); *F16M 11/22* (2013.01)

(58) Field of Classification Search
CPC ...... H05K 5/0204; H05K 5/0286; H05K 5/03; F16M 11/10; F16M 11/22; F16M 11/105;
(Continued)

(56) References Cited

U.S. PATENT DOCUMENTS 6,437,975 B1 * 8/2002 Huang ................. F16M 11/105
                                                    361/825
7,766,288 B2 * 8/2010 Kim ....................... F16M 11/38
                                                    248/176.1
(Continued)

FOREIGN PATENT DOCUMENTS

CN    101676592 A    3/2010
CN    101725801 A    6/2010
(Continued)

OTHER PUBLICATIONS

Translation of CN109058700A (Year: 2018).*
(Continued)

*Primary Examiner* — Abhishek M Rathod
(74) *Attorney, Agent, or Firm* — Ladas & Parry LLP

(57) ABSTRACT

An interactive information terminal with variable form, comprising an information terminal, a rotating device, and a bracket, wherein the information terminal is fixed on the bracket by the rotating device, the rotating device includes a fixing member, a rotating member, and a rotating shaft, the fixing member is detachably connected with the information terminal, the rotating member is detachably connected with the bracket, and the rotating member is rotatably connected
(Continued)

with the fixing member through the rotating shaft, so as to realize that the rotating member rotates around the axial line of the rotating shaft.

18 Claims, 18 Drawing Sheets

(51) Int. Cl.
*F16M 11/10* (2006.01)
*F16M 11/22* (2006.01)

(58) Field of Classification Search
CPC .. F16M 11/38; F16M 2200/024; F16M 11/42; F16M 11/01; G09F 27/00
See application file for complete search history.

(56) References Cited

U.S. PATENT DOCUMENTS

| | | | | |
|---|---|---|---|---|
| 7,837,159 B2* | 11/2010 | Tsuo | ................... | F16M 11/105 |
| | | | | 248/144 |
| 7,984,889 B2* | 7/2011 | Whitley | ................. | F16M 11/16 |
| | | | | 248/222.12 |
| 8,035,957 B2* | 10/2011 | Jung | .................... | F16M 11/105 |
| | | | | 361/679.06 |
| 8,351,193 B2* | 1/2013 | Huang | ................. | G06F 1/1681 |
| | | | | 439/535 |
| 8,373,978 B2* | 2/2013 | Kuan | ................... | F16M 13/005 |
| | | | | 361/679.21 |
| 8,991,775 B2* | 3/2015 | White | .................... | F16M 11/08 |
| | | | | 248/125.7 |
| 9,791,095 B2* | 10/2017 | Chen | .................... | F16M 11/105 |
| 10,244,643 B1* | 3/2019 | Yun | .......................... | H05K 5/02 |
| 10,656,672 B2* | 5/2020 | Youn | ....................... | H04R 1/025 |
| 10,718,966 B2* | 7/2020 | Imaoku | .................. | G02F 1/1347 |
| 10,761,800 B2* | 9/2020 | Seo | ..................... | G09F 15/0006 |
| 2005/0179704 A1* | 8/2005 | Chu | .................... | F16M 11/105 |
| | | | | 340/691.6 |
| 2006/0201098 A1* | 9/2006 | Jung | .................... | F16M 11/105 |
| | | | | 52/653.1 |
| 2009/0001239 A1* | 1/2009 | Dong | .................... | F16M 11/18 |
| | | | | 248/422 |
| 2009/0314912 A1* | 12/2009 | Whitley | ................. | F16M 11/16 |
| | | | | 248/299.1 |
| 2012/0019994 A1* | 1/2012 | Kuan | ................... | H05K 5/0204 |
| | | | | 361/679.01 |
| 2012/0273630 A1* | 11/2012 | Gillespie-Brown | ........................ | |
| | | | | F16M 11/105 |
| | | | | 248/122.1 |
| 2019/0014670 A1* | 1/2019 | Lee | ...................... | H05K 5/0217 |
| 2019/0041684 A1* | 2/2019 | Imaoku | ................. | G02F 1/1347 |
| 2019/0098772 A1* | 3/2019 | Yun | ...................... | H05K 5/0221 |
| 2021/0352811 A1* | 11/2021 | Zhou | ..................... | F16M 11/105 |
| 2023/0253529 A1* | 8/2023 | Kim | ...................... | H01L 33/005 |
| | | | | 257/79 |

FOREIGN PATENT DOCUMENTS

| | | | | |
|---|---|---|---|---|
| CN | 206958533 U | | 2/2018 | |
| CN | 109058700 A | * | 12/2018 | ............. F16M 11/06 |
| CN | 109058700 A | | 12/2018 | |
| CN | 209708597 U | | 11/2019 | |
| JP | 3076665 U | | 4/2001 | |
| JP | 2008281602 A | | 11/2008 | |
| JP | 2010226268 A | | 10/2010 | |
| JP | 2012123077 A | | 6/2012 | |
| KR | 20050083378 A | | 8/2005 | |

OTHER PUBLICATIONS

International Search Report dated Mar. 16, 2020 for Application No. PCT/CN2019/126315.
Official Action #1 for Australia Application No. 2019424684, dated Sep. 5, 2022, 3 pages.
Extended European Search Report for Application No. EP 3913607, dated Feb. 28, 2022, 7 pages.
India Office Action for Application No. 202117035758, dated Jul. 7, 2022, 6 pages.
Japan Office Action 1 for Application No. 2021-543296, dated Dec. 27, 2022, 7 pages.
Korea Written Opinion for Application No. 10-2021-7025079, dated Jan. 16, 2023, 14 pages.
Written Decision on Registration, KR application No. 10-2021-7025079, dated Nov. 11, 2023.

* cited by examiner

US 11,950,381 B2

INTERACTIVE INFORMATION TERMINAL WITH VARIABLE FORM

CROSS-REFERENCE TO RELATED APPLICATION

This application is a Continuation of international Patent Application No. PCT/CN2019/126315 filed on 18 Dec. 2019, which claims priority to Chinese patent application with the Application No. 201920141703.4, which is filed to CNIPA on Jan. 25, 2019, and the entire contents of the above application are incorporated in the present application by reference.

FIELD OF THE INVENTION

The present application relates to the technical field of intelligent electronic devices, for example, to an interactive information terminal with variable form.

BACKGROUND OF THE INVENTION interactive intelligent panels such as conference machines, which integrate computers, projectors, electronic whiteboards, TVs, advertising machines and speakers, have functions such as writing, annotation, synchronous interaction, multimedia, and remote video conference, with the integration of multiple technologies such as high-definition display, human-computer interaction, multimedia information processing and network transmission, and are commonly used in government or enterprise conference rooms, media studios, education and training institutions and other places.

Related conference machines usually include a host and a tripod. The host is installed on the tripod, and the host can be selectively fixed on the tripod, or can selectively swing up and down or left and right relative to the tripod, or rotate at a certain angle horizontally along the axial line relative to the tripod. Related conference machines have the following defects: 1. regardless of the structure of the host, the power or data lines are mostly led out from the lower or left and right side edges of the host. When the host can rotate relative to the tripod, the host will pull the power or data lines, causing the power or data lines to loosen or even fall off, and the power and data lines will also hinder the rotation of the host 2. Most of the related rotary-type hosts do not have a structure for rotation in-place reminder, and it is easy to rotate excessively, causing that it is not easy for the position of the host to be accurately located at the required position, which increases the difficulty of rotation adjustment 3. The sound inlet of the relevant conference machine is arranged on the front surface of the host, and the microphone and other components are located directly behind the sound inlet. This structure will make the thickness of the host of the conference machine relatively large, which cannot realize the thin and light design of the conference machine. 4. The fixing between the shells of the related conference machines is locked by screws through the manner of locking the screws from back to front. This manner requires a longer size of the side frame inserting between the module and the rear shell, and the size in the thickness direction of the host is greater than the length of the screw, which is inconvenient for the host to be thin and light. 5. When the host of the conference machine is set to be rotatable, the rear shell of the host is directly connected with the rotating shaft, and the area of the connection position is narrow, causing that the rear shell is prone to deformation. 6. When the host of the conference machine is set to be rotatable, the damping between the stator disk and the rotor disk of the rotating shaft is mostly designed to a certain value, which is inconvenient to adjust a required damping value according to the usage habits of a user, which reduces the experience of the user. 7. Most of the related conference machines adopt the design manner of touch wiring on the left and right sides and the bottom, and the wiring is complicated. 8. Related conference machines adopt a single system processing manner, and definitely, dual systems may also be provided, but most of the processing systems are integrated in the host of the conference machine and cannot be disassembled. Therefore, the processing system cannot also be replaced at will as required.

SUMMARY OF THE INVENTION

The present application provides an interactive information terminal with variable form, which has a simple structure, convenient rotation adjustment and convenient lead-out of wire without hindering the rotation of the host.

The present application provides an interactive information terminal with variable form, of which the host can realize in-position reminder when the host rotates, thereby reducing the difficulty of rotation adjustment.

The present application provides an interactive information terminal with variable form, which has beautiful appearance, reliable connection and small thickness.

The present application provides an interactive information terminal with variable form, of which the damping is adjustable when the host rotates, and the adjustment operation is simple and convenient.

The present application provides an interactive information terminal with variable form, of which the rotation is stable and reliable.

The present application provides an interactive information terminal with variable form, of which the modules are simple to be fixed and are not easily deformed.

The present application provides an interactive information terminal with variable form, of which the system can be designed in modules, facilitating personalized design.

An interactive information terminal with variable form comprises: an information terminal, a rotating device, and a bracket, wherein the information terminal is fixed on the bracket by the rotating device, the rotating device includes a fixing member, a rotating member, and a rotating shaft, the fixing member is detachably connected with the information terminal, the rotating member is detachably connected with the bracket, and the rotating member is rotatably connected with the fixing member through the rotating shaft, so as to realize that the rotating member rotates around an axial line of the rotating shaft.

The fixing member includes a first, body having a circular shape, and at least one protrusion is provided on an outer periphery of the first body; the rotating member includes a second body, and at least a first groove for being plugged by and matched with the protrusion is provided, correspondingly to a rotation start point and a rotation end point of the information terminal, on the second body.

The protrusion includes a first plate and a second plate that are vertically connected, the first plate is detachably connected with a side of the fixing member deviating from the rotating member by a screw, the second plate is arranged on a side of the first plate close to the rotating member, an elastic sheet structure is convexly provided on a side of the second plate facing away from a center of the fixing member, two protruding pillars are provided on the second body at intervals, and the first groove is formed between the two protruding pillars.

The rotating device further includes a limit assembly, and the limit assembly is used to limit an angle at which the rotating member can rotate relative to the fixing member, the limit assembly includes a limit pin and an arc-shaped limit slot, the arc-shaped center of the limit slot is concentric with an axial center of the rotating shaft one of the limit pin and the limit slot is arranged on the fixing member, and the other of the limit pin and the limit slot is arranged on the rotating member.

A wire through hole is penetrated through the rotating shaft.

The fixing member is connected with the bracket through a connecting assembly, the connecting assembly includes a connecting member and an adapter member detachably arranged at two opposite ends of the connecting member, and an end of the adapter member away from the connecting member is detachably connected with the bracket.

The rotating device further includes a damping adjustment assembly, the damping adjustment assembly includes an adjustment seat, an adjustment screw, and a damping sheet, the adjustment screw is screwed on the adjustment seat, the damping sheet is connected with an end portion of the adjustment screw and selectively abuts against a side of the fixing member deviating from the rotating member.

The information terminal comprises a display module and a rear shell arranged on a rear side of the display module, the display module includes a back plate, and a diaphragm assembly and a tempered glass that are sequentially arranged on a side of the back plate away from the rear shell, a reinforcement frame is provided on a side of the back plate close to the rear shell, the rotating member is fixed on the reinforcement frame by a screw, and a through hole for the screw to pass through is opened at a corresponding position of the rear shell.

The information terminal further comprises a frame wrapped on a periphery portion of the display module, the frame and the back plate are connected by an adapter plate, the adapter plate includes a first adapter plate and a second adapter plate, wherein the first adapter plate is arranged between the frame and a side edge of the back plate, and is connected with the frame and a side edge of the hack plate by a screw, the second adapter plate is perpendicular to the first adapter plate, and the second adapter plate is located between the hack plate and the rear shell, and is connected with the hack plate by a screw.

The adapter plate further includes an elastic sheet connected to the second adapter plate, and the elastic sheet can elastically abut against a side of the rear shell close to the back plate, so as to fix the rear shell on the hack plate.

The interactive information terminal with variable form of the present application has a simple structure, convenient and reliable rotation adjustment, stability during rotation, convenient lead-out of wires without hindering rotation, and can realize a thin and light design.

BRIEF DESCRIPTION OF THE DRAWINGS

Hereinafter, the present application will be farther described in detail based on the drawings and embodiments.

DESCRIPTION OF THE PREFERRED EMBODIMENTS

Figure 1:
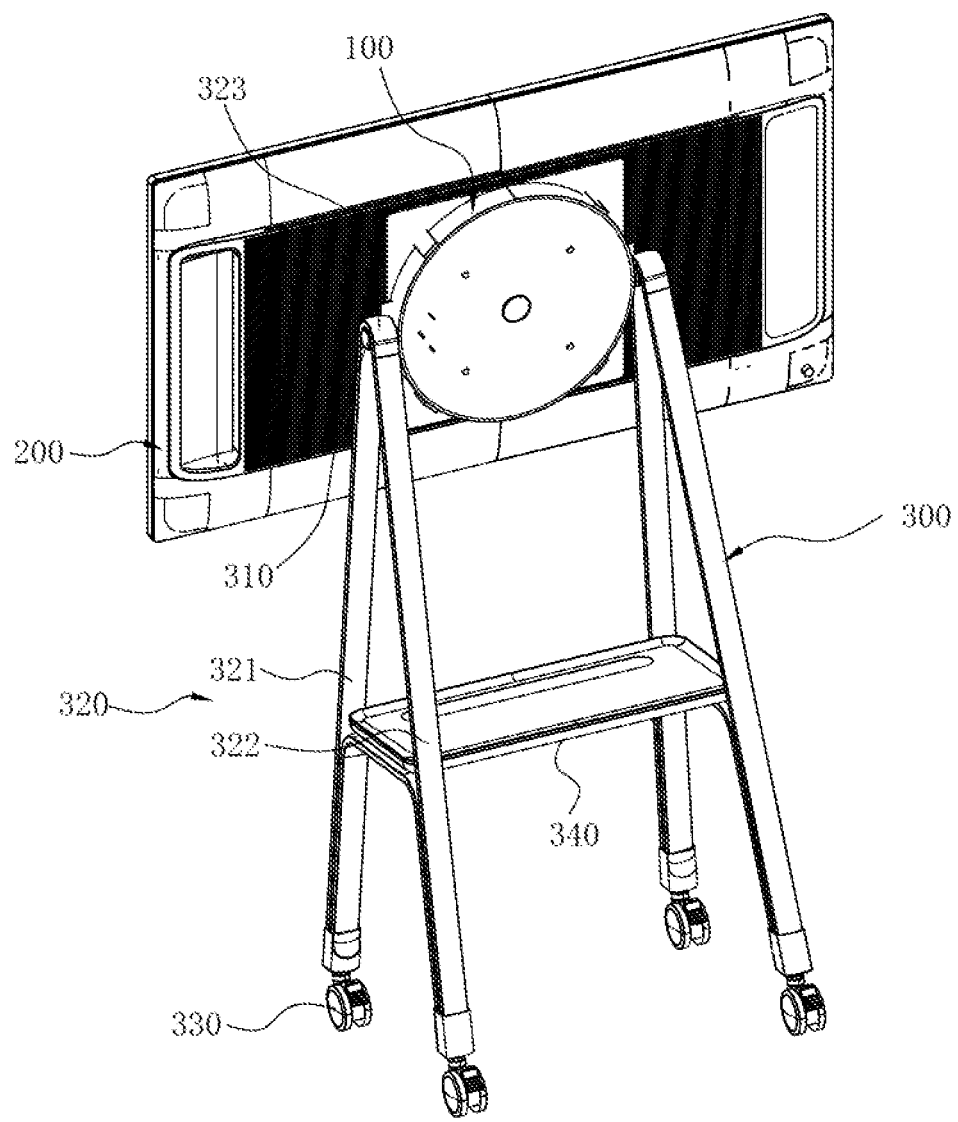
FIG. 1 is a three-dimensional schematic diagram of an interactive information terminal with variable form according to an embodiment of the present application.
Figure 2:
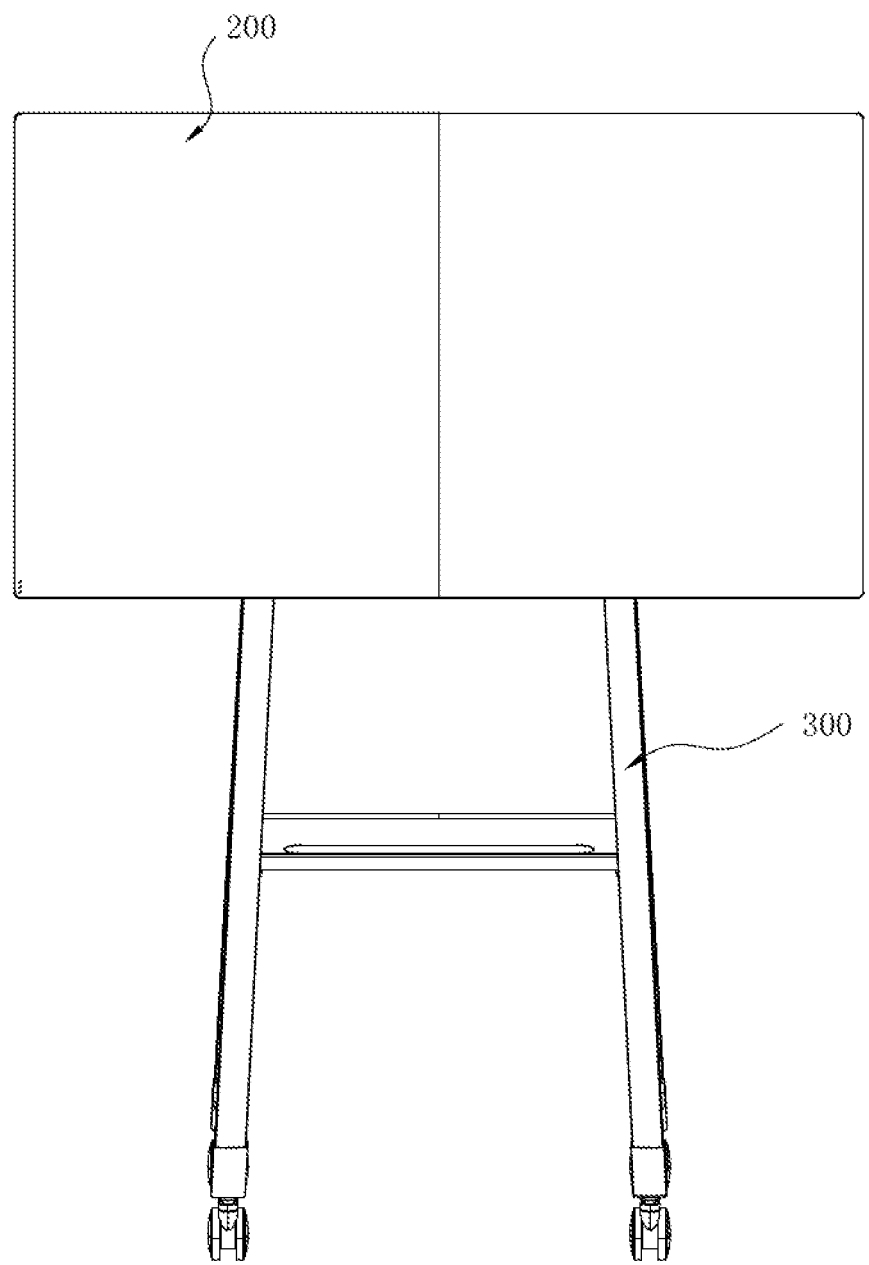
FIG. 2 is a schematic main view of an interactive information terminal with variable form according to the embodiment of the present application.
Figure 3:
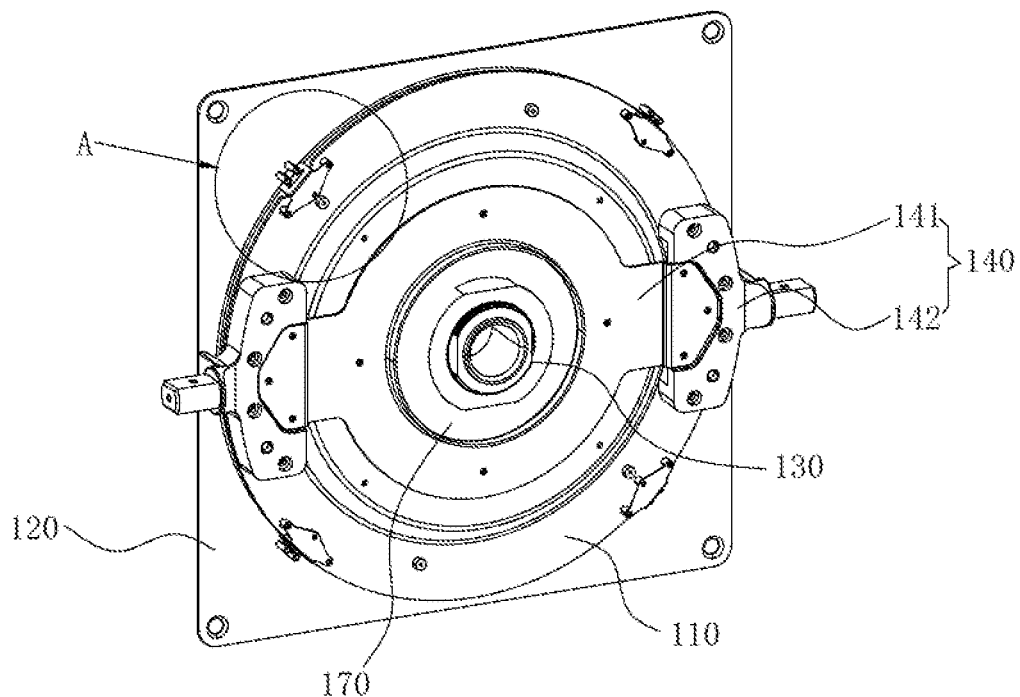
FIG. 3 is a three-dimensional schematic diagram (the rears cover is not shown) of a rotating device according to one embodiment of the present application.
Figure 4:
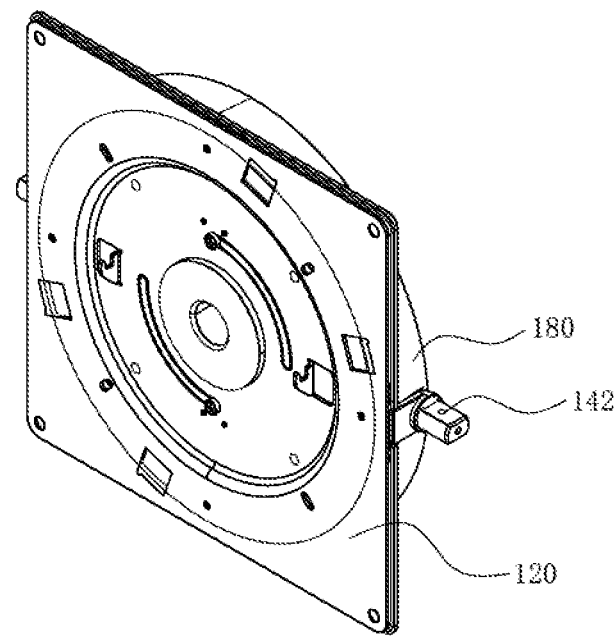
FIG. 4 is a three-dimensional schematic diagram of the rotating device from another perspective according to one embodiment of the present application.

In order to make the technical problems solved by the present application, the adopted technical solutions, and the achieved technical effects more clear, the technical solutions of the embodiments of the present application will be described in further detail hereinafter in conjunction with the accompanying drawings. Obviously, the described embodiments are only a part of embodiments of the present application, not all the embodiments. In the description of the present application, unless expressly stipulated and restricted otherwise, the terms "connected with", "connected", and "fixed" should be interpreted broadly, for example, they may be fixedly connected, detachably connected, or integrated, or may be a mechanical connection or an electrical connection, or may be directly connected or indirectly connected through an intermediate medium, and may be the internal communication between two components or the interaction relationship between two components. For those skilled in the art, the concrete meaning of the above-mentioned tennis in the present application can be understood under concrete circumstances.

In the present application, unless expressly stipulated and defined otherwise, a first feature being "above" or "below" a second feature may include that the first feature directly contacts with the second feature, or may include that the first feature does not directly contact with the second feature, rather than contact through another feature therebetween. Moreover, the first feature being "above", "over" and "on" the second feature may include that the first feature is directly above and obliquely above the second feature, or simply means that the height of the first feature is higher than that of the second feature. The first feature being "below", "under" and "underneath" the second feature includes that the first feature is directly below and obliquely below the second feature, or simply means that the level of the first feature is smaller than that of the second feature.

As shown in FIGS. 1 to 29, the interactive information terminal with variable form of an embodiment of the present application includes an information terminal 200, and a bracket 300 supporting and fixing the information terminal 200, wherein the information terminal 200 can be designed to rotate along an axial line parallel to the horizontal direction relative to the bracket 300, or the information terminal 200 can either rotate along an axial line parallel to the horizontal direction relative to the bracket 300, or move along the vertical direction relative to the bracket 300.

The information terminal 200 has the ability to present information such as images and texts. In an exemplary embodiment, the information terminal 200 is an interactive intelligent panel (IIP), and the interactive intelligent panel is a device with independent processing capabilities, and can at least independently perform one or more functions selected from the group consisting of image/video display, touch interaction, shooting, audio and video play, and data processing.

In other embodiments, the information terminal 200 may be an electronic whiteboard. The electronic whiteboard is used to receive images projected by the projector and has the function of touch feedback, which does not have the ability to independently perform functions of data processing, audio and video play, etc. However, relying on an external device, the electronic whiteboard can achieve functions similar to interactive intelligent panels.

Hereinafter, the structure in which the information terminal 200 is an interactive intelligent panel and rotates along an axial line parallel to the horizontal direction relative to the bracket 300 is taken as an example to explain the contents of this embodiment.

As shown in FIGS. 3 to 9, the information terminal 200 is connected with the bracket 300 through a rotating device 100. The rotating device 100 includes a fixing member 110, a rotating member 120, and a rotating shaft 130. The fixing member 110 is fixed on the bracket 300 through a connecting assembly 140. The rotating member 120 is connected with the fixing member 110 through the rotating shaft 130 and can rotate a preset angle around the axial line of the rotating shaft 130. The information terminal 200 is installed on the side of the rotating member 120 deviating from the fixing member 110. By fixing the fixing member 110 on the bracket 300, the stability of the rotating device 100 can be enhanced, which prevents the rotating device 100 from shaking relative to the bracket 300.

The fixing member 110 includes a first body 111 having a circular shape. A first convex portion 112 is convexly provided on one side of the center of the first body 111 deviating from the rotating member 120. The first convex portion 112 is internally provided with a first accommodating slot 113 opening towards the rotating member 120. The slot bottom of the first accommodating slot 113 is opened with a first rotating shaft hole 114, the outer periphery of the first body 111 is provided with at least one protrusion 115. The rotating member 120 includes a second body 121, and at least a first groove 122 for being plugged by and matched with the protrusion 115 is provided on the second body 121 correspondingly to a rotation start point and a rotation end point of the information terminal 200. When the rotating member 120 rotates relative to the fixing member 110, the protrusion 115 can rotate into the first groove 122, and in the process of plugging the protrusion 115 into the first groove 122, a sound will be generated to remind the user of the in-position rotation.

Optionally, four protrusions 115 are uniformly distributed on the periphery portion of the first body 111, and four first grooves 122 are provided on the second body 121. This design can remind one in-position rotation every time the information terminal 200 rotates 90 degrees, and the structure of the four protrusions 115 matching with the first groove 122 can also assist in fixing the position of the rotating member 120 and the information terminal 200 after being rotated in place, which prevents the rotating member 120 and the information terminal 200 from being rotated at will, and at the same time, can reduce the shaking of the rotating member 120 and the information terminal 200.

The protrusion 115 includes a first plate 1151 and a second plate 1152 that are vertically connected, wherein the first plate 1151 is detachably connected with the side of the fixing member 110 deviating from the rotating member 120 by a screw, and the second plate 1152 is provided on the side of the first plate 1151 close to the rotating member 120, an elastic sheet structure 1153 is convexly provided on the side of the second plate 1152 facing away from the center of the fixing member 110, two protruding pillars 123 are provided on the second body 121 of the rotating member 120 at intervals, and the first groove 122 is formed between the two protruding pillars 123. When the rotating member 120 is rotated, if the elastic sheet structure 1153 rotates to the protruding pillar 123, the elastic sheet structure 1153 is squeezed and deformed due to the external force to enter the first groove 122 located between the two protruding pillars 123. And at this time, the external force applied to the elastic sheet structure 1153 is withdrawn, and the elastic sheet structure 1153 returns to the form before being squeezed and deformed. The sound will be generated during the whole process to remind the user of the in-position rotation.

Definitely, the first groove 122 is not limited to being formed by two protruding pillars 123 provided at intervals. In other embodiments, a bump may be convexly provided on the second body 121, and the first groove 122 is concavely formed on the side surface of the bump close to the fixing member 110, or a ring plate is annularly protruded on the second body 121, and the first groove 122 is concavely arranged on the inner wall of the ring plate.

Figure 5:
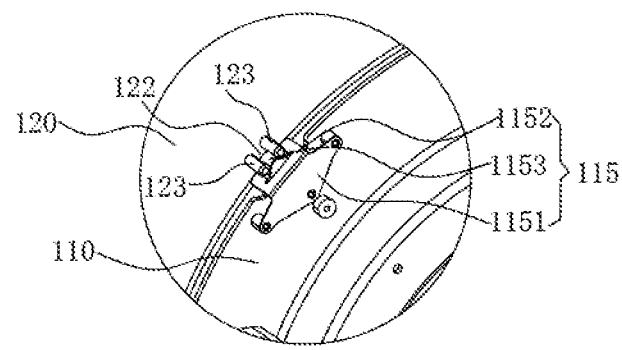
FIG. 5 is an enlarged schematic diagram of A in FIG. 3.
Figure 6:
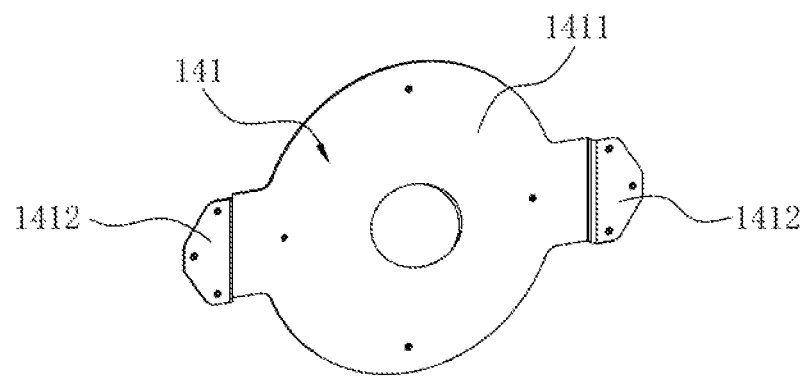
FIG. 6 is a schematic structure diagram of a connecting member according to the embodiment of the present application.
Figure 7:
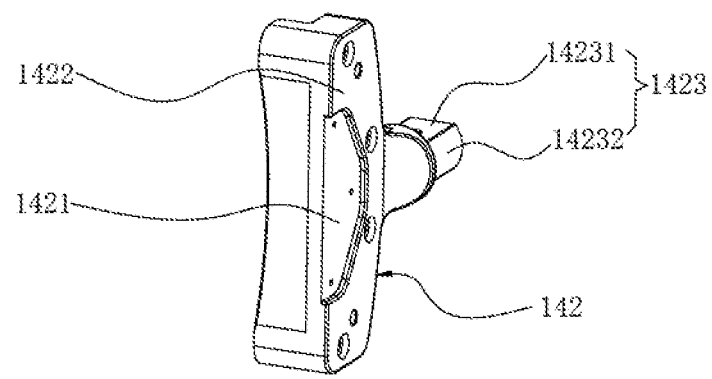
FIG. 7 is a schematic structure diagram of an adapter member according to the embodiment of the present application.
Figure 8:
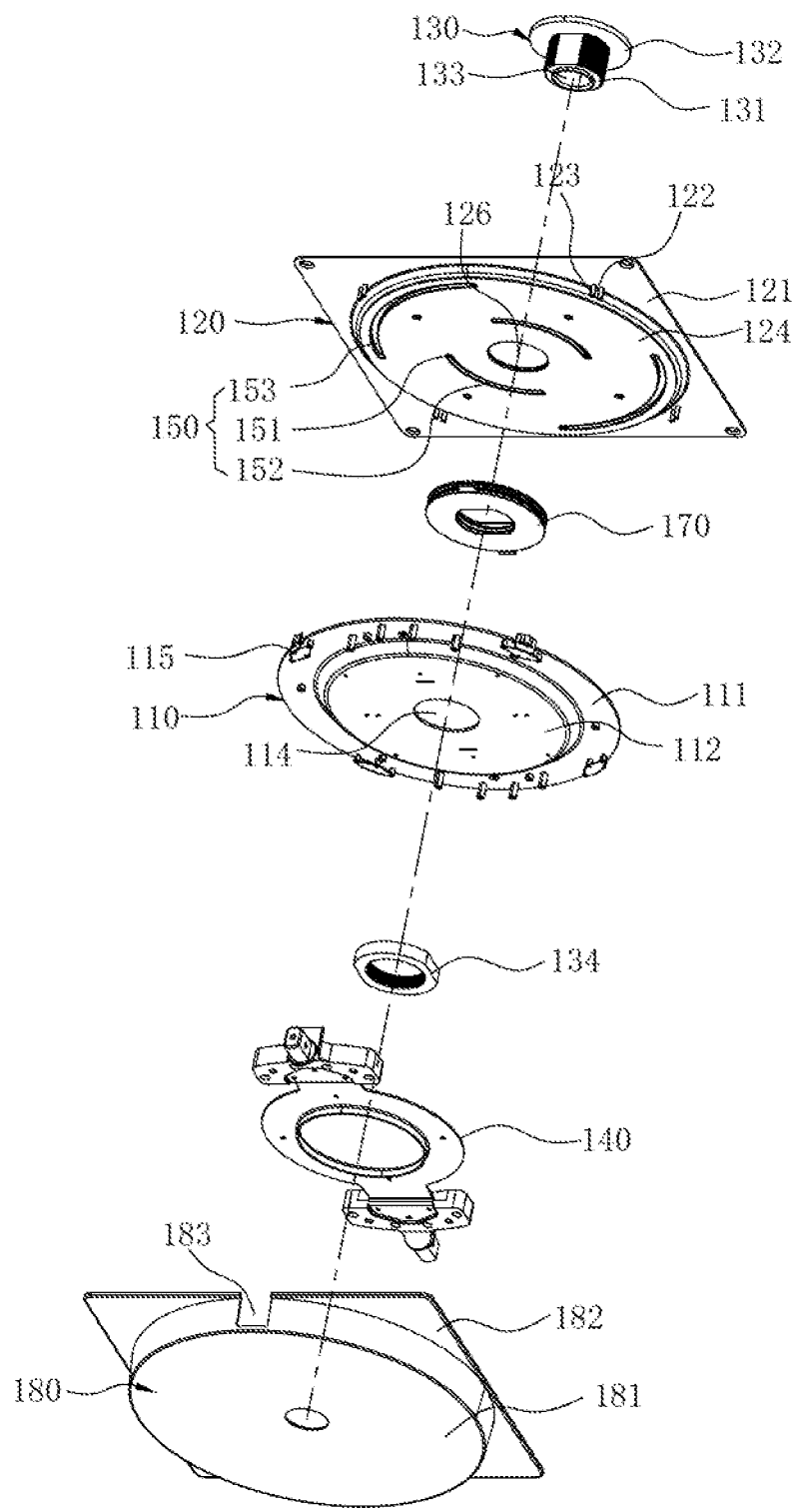
FIG. 8 is an exploded view of a rotating device from a first perspective according to one embodiment of the present application.
Figure 9:
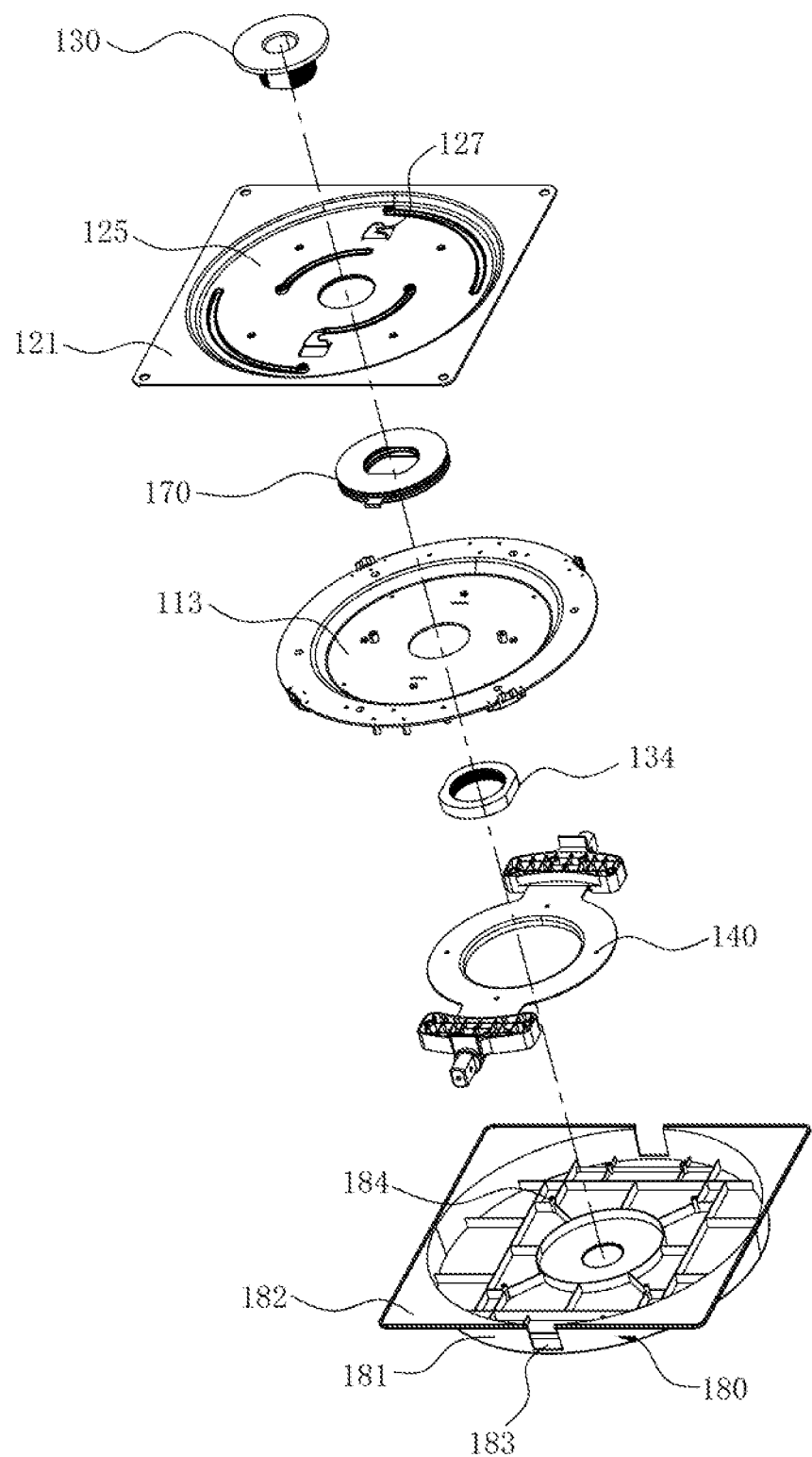
FIG. 9 is an exploded view of a rotating device from a second perspective according to one embodiment of the present application.
Figure 10:
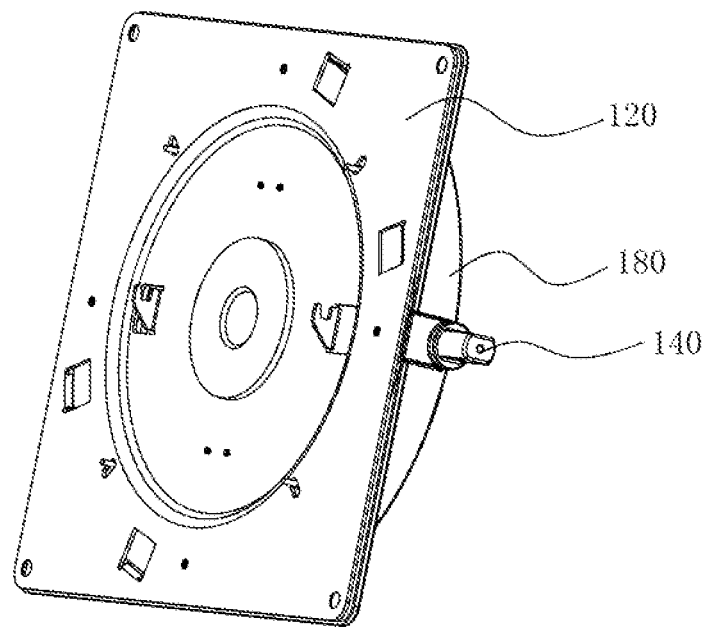
FIG. 10 is a three-dimensional schematic diagram of a rotating device according to another embodiment of the present application.
Figure 11:
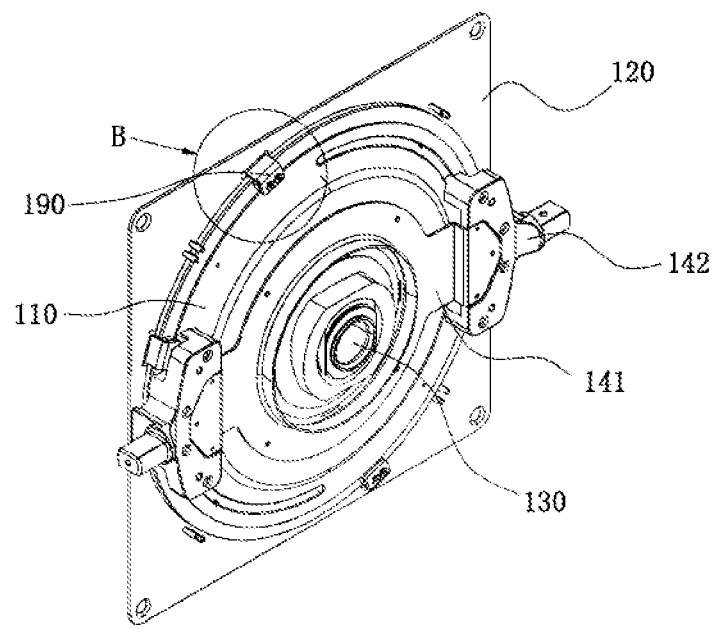
FIG. 11 is a three-dimensional schematic view (the rear cover is not shown) of a rotating device from another perspective according to another embodiment of the present application.

In one embodiment, referring to FIGS. 5 and 8, the second body 121 is convexly provided with a second convex portion 124 toward the first body 111, the cross section of the second convex portion 124 is circular, and the second convex portion 124 is located at the center of the second body 121. The outer peripheral wall of the second convex portion 124 and the protruding pillar 123 are provided at intervals, and a space for the second plate 1152 of the protrusion 115 to pass through is formed. The distance between the outer peripheral wall of the second convex portion 124 and the protruding pillar 123 is greater than the thickness of the second plate 1152, and meanwhile, is smaller than the height of the elastic sheet structure 1153 protruding from the second plate 1152. By providing the second convex portion 124, the second convex portion 124 can be used to limit the position of the protrusion 115, which facilitates the more accurate and reliable cooperation between the protrusion 115 and the first groove 122 during rotation, and meanwhile, also prevents the second plate 1152 of the protrusion 115 from being greatly deformed.

A second accommodating slot 125 is opened in the second convex portion 124, the slot opening of the second accommodating slot 125 faces the information terminal 200, and the center of the slot bottom of the second accommodating slot 125 is opened with a second rotating shaft hole 126.

In one embodiment, referring to FIG. 8, the rotating device 100 further it a limit assembly 150, and the limit assembly 150 is used to limit the angle at which the rotating member 120 can rotate relative to the fixing member 110. The limit assembly 150 includes a limit pin 151 and an arc-shaped limit slot. The arc-shaped center of the limit slot is concentric with the axial center of the rotating shaft 130. One of the limit pin 151 and the limit slot is arranged on the fixing member 110, and the other of the limit pin 151 and the limit slot is arranged on the rotating member 120.

In this embodiment, the limit pin 151 is fixed on the side of the fixing member 110 close to the rotating member 120, the rotating member 120 is opened with this limit slot. The structure formed by cooperating rotating shaft 130, the limit pin 151 and the limit slot makes the rotation of the rotating member 120 more stable and reliable, thereby reducing the shaking of the information terminal 200 during the rotation.

The arc-shape angle of the limit slot is 90 degrees. This design can enable the information terminal 200 to switch freely between the horizontal screen and the vertical screen.

In this embodiment, the limit slot includes two first limit slots 152 and two second limit slots 153. Centering on the axial center of the rotating shaft 130, the two first limit slots 152 are symmetrically located on a first circumference, and the two second limit slots 153 are symmetrically located on a second circumference. The diameter of the first circumference is not equal to that of the second circumference, and the diameter of the first circumference is smaller than that of the second circumference.

The center connecting line of the two first limit slots 152 is a first connecting line, and the center connecting line of the two second limit slots 153 is a second connecting line. The first connecting line and the second connecting line are perpendicular and intersecting. The intersection point of the first connecting line and the second connecting line coincides with the axial center of the rotating shaft 130. This design can provide four limit slots on the rotating member 120, and the four limit slots are distributed along the four positions of 0°, 90°, 180° and 270°, which ensures the stability of the information terminal 200 during use. No matter from which angle the user operates the information terminal 200, the information terminal 200 does not shake.

The arc-shaped radius of the second limit slot 153 is greater than that of the first limit slot 152.

Definitely, it is not limited to using the four limit slots at the same time to limit the rotating member 120, but also can only limit the first limit slot 152 or the second limit slot 153 respectively, which can also achieve a certain stabilizing effect.

With reference to FIG. 8, the limit pin 151 includes a pin rod and a limit plate fixed at one end of the pin rod. The end of the pin rod away from the limit plate is opened with a threaded hole. A through hole is opened by penetrating through the slot bottom of the first accommodating slot 113 of the fixing member 110. The screw passes through the through hole and is screwed into the threaded hole, so as to fix the pin rod on the slot bottom of the first accommodating slot 113 of the fixing member 110, and the limiting plate is located on the side of the rotating member 120 deviating from the fixing member 110. Definitely, the structure of the limit pin 151 is not limited to the above structure. The limit pin 151 can also be arranged as a pin rod with screw threads. One end of the pin rod is provided with a limit plate, and the other end of the pin rod is screwed in the threaded hole on the fixing member 110.

Figure 12:
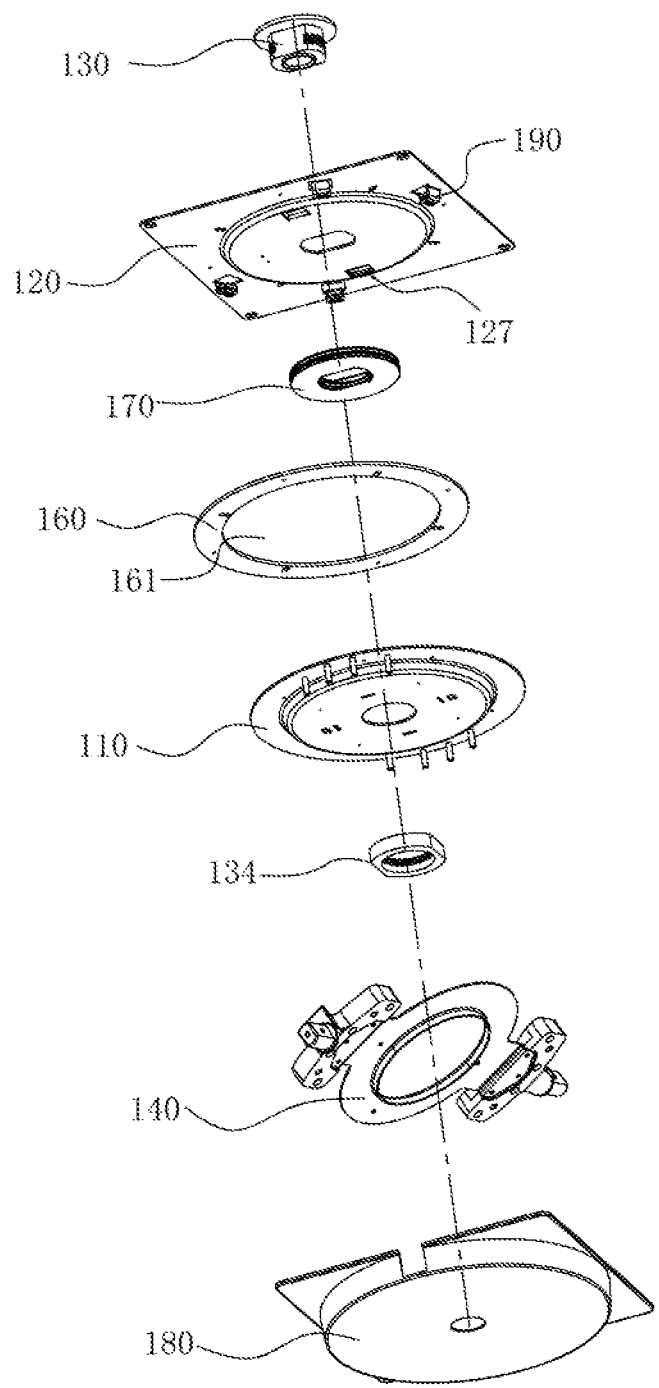
FIG. 12 is an exploded view of a rotating device tin in a first perspective according to another embodiment of the present application.
Figure 13:
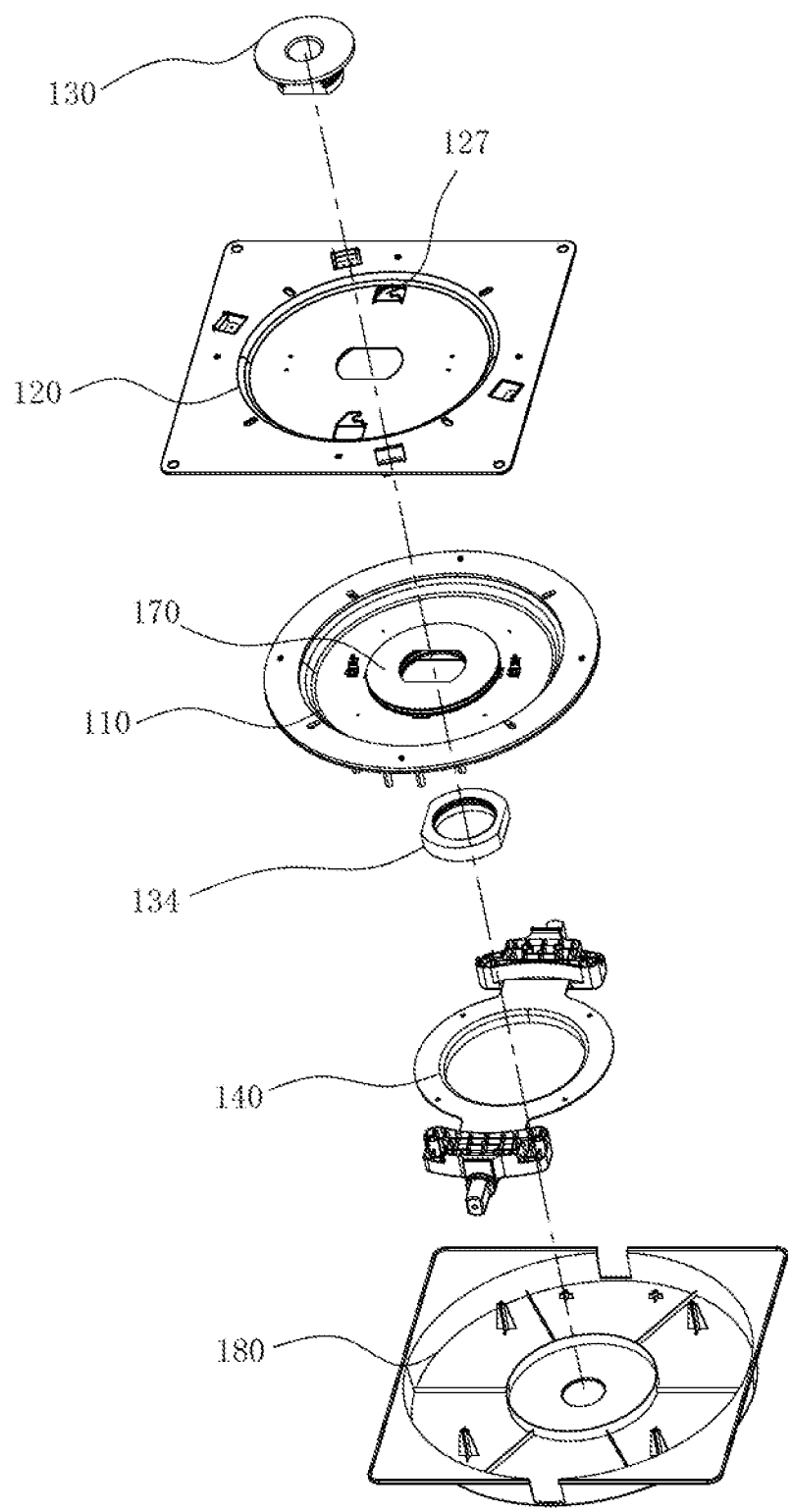
FIG. 13 is an exploded view of a rotating device from a second perspective according to another embodiment of the present application.

With reference to FIG. 12, a wear-resistant plate 160 is provided between the rotating member 120 and the fixing member 110. The wear-resistant plate 160 is fixed on the rotating member 120, and used for isolating the rotating member 120 and the fixing member 110. The wear-resistant plate 160 is opened with a third rotating shaft hole 161 for the shaft 130 to pass through.

In other embodiments, the wear-resistant plate 160 can also be configured to the structure of isolating the rotating member 120 and the fixing member 110 as a whole, that is, the wear-resistant plate 160 completely shields the fixing member 110. The wear-resistant plate 160 also needs to be opened with via holes, of which the positions and the number correspond to the limit slots on the rotating member 120.

Optionally, the wear-resistant plate 160 is made of wear-resistant plastic, and the wear-resistant plate 160 is made of POM. POM is polyformaldehyde thermoplastic crystalline polymer, which is known as "super steel" or "SAI steel", also known as polyoxymethylenes. POM has high strength and rigidity, good elasticity, good wear reduction and wear resistance, and excellent mechanical properties. The specific strength can reach 50.5 MPa and the specific stiffness can reach 2650 MPa, which is very close to metal. The mechanical properties of POM change little with temperature, and the change of copolymerized POM is slightly larger than that of homopolymerized POM. POM has a high impact strength, a small friction factor, good wear resistance, and good self-lubricating property.

The wear-resistant plate 160 can be fixed on the rotating member 120 by screws, or pasted on the rotating member 120 by glue, or installed on the rotating member 120 by a buckle assembly.

In addition, a protective part (not shown in the figure) can be arranged in the limit slot, and the protective part is annularly arranged along the slot wall of the limit slot, and the protective part can be made of wear resistant plastic. The protective part is made of POM. The protective part can be fixed in the limit slot by screws, or pasted in the limit slot by glue.

Figure 14:
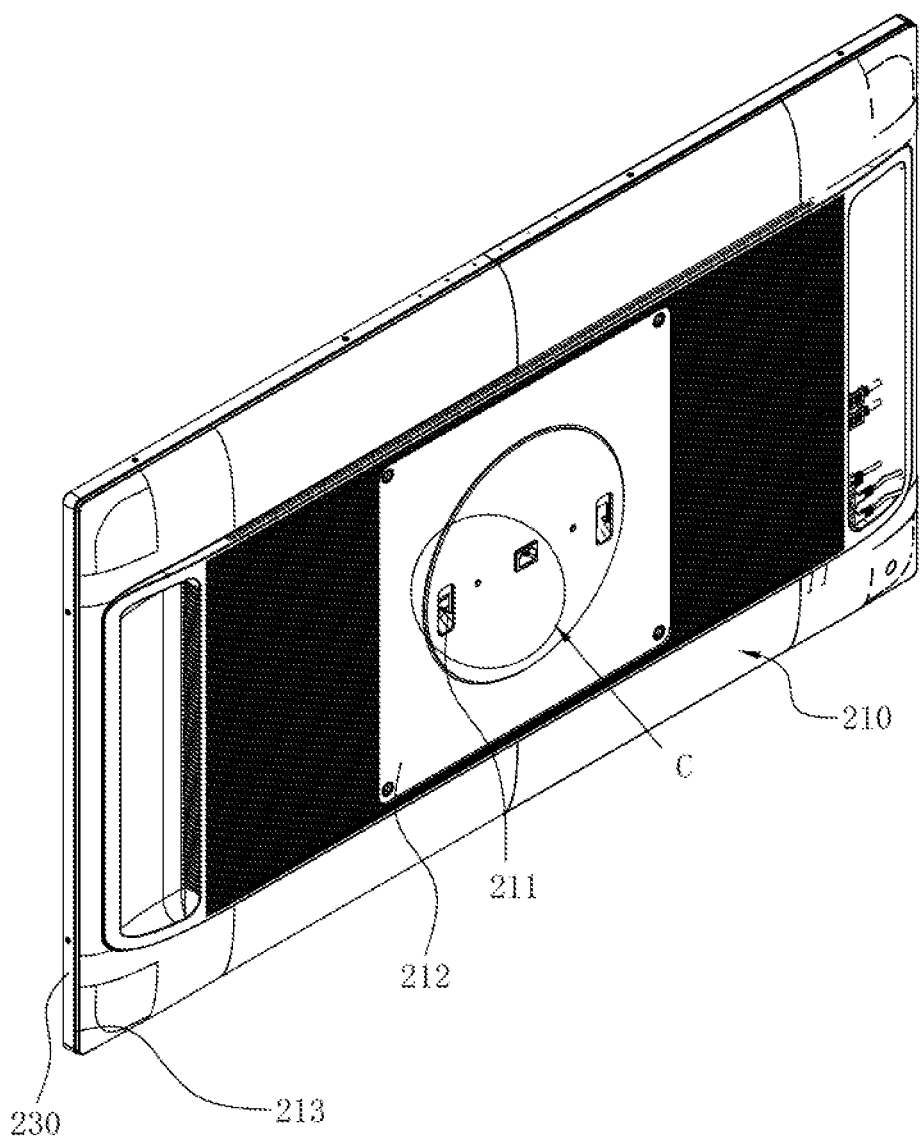
FIG. 14 is a three-dimensional schematic diagram of an information terminal according to the embodiment of the present application.
Figure 15:
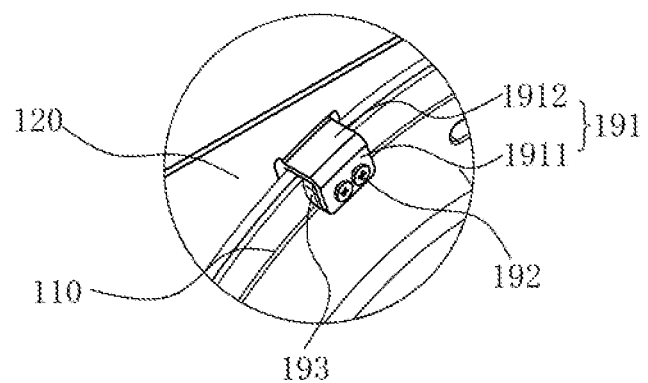
FIG. 15 is an enlarged schematic diagram of B in FIG. 11.
Figure 16:
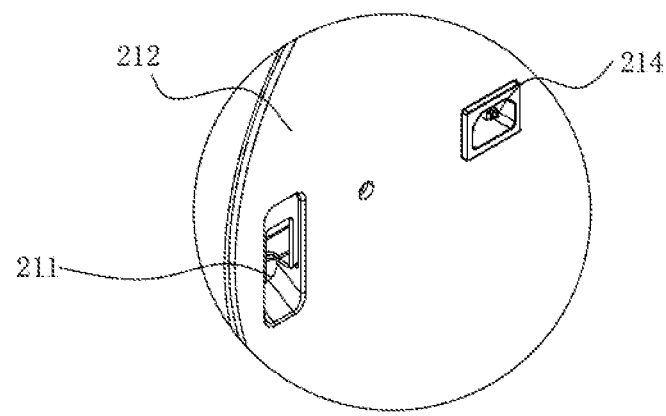
FIG. 16 is an enlarged schematic diagram of C in FIG. 14.

In one embodiment, as shown in FIGS. 14 and 16, the slot bottom of the second accommodating slot 125 of the rotating member 120 is convexly provided with two hooks 127, and the two hooks 127 are separately provided on both sides of the rotating shaft 130. The information terminal 200 of the interactive intelligent panel is provided with matching slots 211 that are matched with the hooks 127. The matching slots 211 are opened on the rear shell 210 of the information terminal 200. When the information terminal 200 is located at the position of the rotation start point, the opening of the hook 127 faces upwards. The matching slot 211 includes a first slot body concavely arranged on the rear side of the information terminal 200, and a second slot body plugged by and matched with a hook body portion of the hook 127, and the second slot body is concavely provided on the slot wall of the first slot body. The arrangement of the hook 127 can reduce the difficulty of fixing the information terminal 200 to the rotating member 120 of the rotating device 100. When installing, first the information terminal 200 is hanged on the hook 127, at this time, the threaded hole on the information terminal 200 is directly opposite to the through hole on the rotating member 120. The staff can screw the screws to fix the information terminal 200 on the rotating member 120 without lifting the information terminal 200, which reduces the operating strength and improves the speed of disassembly and assembly.

The second body 121 of the rotating member 120 is annularly provided with a plurality of through holes. Correspondingly to the through holes, the information terminal 200 is provided with threaded holes, matched in position and quantity. The screws pass through the through holes and are screwed into the threaded holes, so as to lock the information terminal 200 on the rotating member 120.

In one embodiment, the rotating shaft 130 includes a shaft body 131 and an end plate 132 fixed at one end of the shaft body 131. External screw threads are provided on the outside of the shaft body 131, and a wire through hole 133 is opened by penetrating through the shaft body 131 along the axial line of the rotating shaft 130. The wire through hole 133 penetrates through the end plate 132 at the same time. Correspondingly, a power socket 214 is provided on the rear shell 210 of the information terminal 200, and the position of the power socket 214 corresponds to the position of the wire through hole 133. During installation, the end plate 132 is arranged between the information terminal 200 and the rotating member 120, and the shaft body 131 sequentially passes through the second rotating shaft hole 126 on the rotating member 120, the third rotating shaft hole 161 on the wear-resistant plate 160, and the first rotating shaft hole 114 on the fixing member 110, and then is screwed to a limit nut 134. The wire through hole 133 provided by penetrating through the rotating graft 130 can allow wires such as power or signal lines to pass through. This structural design can prevent the information terminal 200 from pulling the wires when rotating with the rotating member 120, thereby effectively avoiding the problem of loosening and falling off of the socket. In addition, the wire is led out from the center of the rotating shaft 130, which will not hinder the rotation of the information terminal 200.

In order to reduce the friction between the rotating shaft 130, and the rotating member 120 and the fixing member 110, wear-resistant gaskets 170 are provided both between the end plate 132 and the rotating member 120, and between the fixing member 110 and the limit nut 134.

In one embodiment, the fixing member 110 is connected with the bracket 300 through the connecting assembly 140.

The connecting assembly 140 includes a connecting member 141 and an adapter member 142 detachably arranged at two opposite ends of the connecting member 141. An end of the adapter member 142 away from the connecting member 141 is detachably connected with a mounting seat. 310 on the bracket 300.

Optionally, the connecting member 141 includes a plate-shaped third body 1411. The third body 1411 is fixed on the fixing member 110 by a screw, and the third body 1411 is fixed on the side surface of the first convex portion 112 away from the rotating member 120 by a screw. The third body 1411 is extended with a plug board 1412. A plug slot 1421 is opened on the adapter member 142. The plug board 1412 is inserted into the plug slot 1421 and then fixed in the plug slot 1421 by a screw. By providing the plug board 1412 and the plug slot 1421, the plug slot 1421 can be used to locate the position of the plug board 1412, which reduces the difficulty of alignment between the threaded holes in the plug slot 1421 and the through holes on the plug hoard 1412 during assembly, and meanwhile, also improves assembly efficiency.

The adapter member 142 includes a fourth body 1422, and the plug slot 1421 is opened on the side of the fourth body 1422. The plug slot 1421 has a first slot opening deviating from the fixing member 110 and a second slot opening facing the third body 1411 of the connecting member 141. During installation, the plug board 1412 of the connecting member 141 is inserted into the plug slot 1421 via the second slot opening, and the screw is screwed into the plug slot 1421 through the first slot opening, so as to fix the plug board 1412 in the plug slot 1421. A connecting pillar 1423 is convexly provided on the side of the fourth body 1422 deviating from the third body 1411 of the connecting member 141, and a threaded hole is opened on the end surface of the connecting pillar 1423.

The bracket 300 includes two outriggers 320 arranged at intervals. A mounting seat 310 is fixed at the upper end of the outrigger 320. The mounting seat 310 is opened with a mounting slot along the horizontal direction. A mounting through hole is opened by penetrating through the slot bottom of the mounting slot. The slot opening of the mounting slot faces the adapter member 142. The connecting pillar 1423 of the adapter member 142 is inserted into the amounting slot. At this time, the threaded hole on the connecting pillar 1423 is directly opposite to the mounting through hole, and the screw is screwed on the side of the mounting seat 310 away from the adapter member 142, so as to fix the adapter member 142 on the bracket 300.

In this embodiment, the connecting member 141 is integrally formed by stamping a sheet metal material, or is formed by machining with a metal material, and the adapter member 142 is integrally cast and formed, that is, the fourth body 1422 and the connecting pillar 1423 are an integral structure. The adaptor member 142 formed by casting can have a relatively large pressure-bearing strength, which can effectively prevent the adaptor member 142 from being deformed.

The connecting pillar 1423 includes at least one limit plane 14231 and an arc-shaped connecting surface 14232 connecting the limit plane 14231, and the shape of the mounting slot matches the shape of the connecting pillar 1423. This design can facilitate quick installation in place. In this embodiment, the connecting pillar 1423 includes two opposite and parallel limit planes 14231, and the two limit planes 14231 are connected by an arc-shaped connecting surface 14232 to form a connecting pillar 1423 with a racetrack-shaped cross section.

The rotating device 100 further includes a rear cover 180. The rear cover 180 includes a fifth body 181. The fifth body 181 has a shape of a cylinder with one open end and one sealed end. The fixing member 110 and the rotating member 120 are located in the fifth body 181. A shielding edge 182 is provided by making the end surface of the open end of the fifth body 181 extend toward the outside of the rear cover 180. The inner side of the sealed end of the fifth body 181 is convexly provided with a fixing pillar 184. A through hole is opened b penetrating through the fixing pillar 184. A threaded hole is opened on the fixing member 110. A screw penetrates through the through hole and is screwed into the threaded hole, so as to fix the fifth body 181 on the fixing member 110, and the shielding edge 182 can completely cover the fixing member 110 and the rotating member 120. By providing the rear cover 180, the fixing member 110 and the rotating member 120 of the rotating device 100 can be shielded, which can not only beautify the appearance of the entire interactive intelligent panel, but also prevent external impurities and water from entering between the fixing member 110 and the rotating member 120, affecting the smoothness of the rotation of the rotating member 120.

The outrigger 320 includes a first rod body 321 and a second rod body 322 that are arranged at an included angle. One end of the first rod body 321 and one end of the second rod body 322 are connected through a connecting rod body 323, and the other end is provided with a wheel 330. The wheel 330 is provided with a brake. The portions of the outriggers 320 other than the ends are connected by a reinforcement plate 340. The reinforcement plate 340 can not only connect the two outriggers 320 to strengthen the support of the outriggers 320, but also can be used as a shelf for placing various items.

In one embodiment, as shown in FIGS. 10 to 13, the rotating device 100 further includes a damping adjustment assembly 190. The damping adjustment assembly 190 includes an adjustment seat 191, an adjustment screw 192, and a damping sheet 193. The adjustment seat 191 includes a first seat plate 1911 parallel to the rotating member 120 and a second seat plate 1912 connecting the first seat plate 1911 to the rotating member 120. A threaded hole is opened on the first seat plate 1911, and the adjustment screw 192 is screwed into the threaded hole and connected with the damping sheet 193. The damping sheet 193 is located on the side of the first seat plate 1911 close to the rotating member 120, and the side of the damping sheet 193 deviating from the first seat plate 1911 selectively abuts against the side of the fixing member 110 deviating from the rotating member 120. By arranging the damping sheet 193 and connecting the damping sheet 193 through the adjustment screw 192, the distance between the damping sheet 193 and the fixing member 110 can be adjusted, and then the damping magnitude of the rotating member 120 when rotating can be adjusted.

Optionally, the adjusting seat 191 is integrally formed with the second body 121 of the rotating member 120, and in a concrete manufacturing process, the adjustment seat 191 is formed by stamping the second body 121.

The distance between the first seat plate 1911 and the second body 121 is greater than the sum of the thicknesses of the fixing member 110 and the damping sheet 193.

At least two damping adjustment assemblies 190 are annularly arranged on the rotating member 120. In this embodiment, three damping adjustment assemblies 190 are annularly and uniformly distributed on the rotating member 120. The annularly and uniformly distributed damping adjustment assembly 190 can form a uniform pressure on the fixing member 110 to ensure that the damping effect is consistent at any position.

The damping sheet 193 is a rubber sheet. The rubber sheet has good wear resistance and a high friction coefficient.

In one embodiment, as shown in FIGS. 17 to 22, the information terminal 200 includes a display module 220 and a rear shell 210 arranged on the rear side of the display module 220. A frame 230 is wrapped on the periphery portion of the display module 220, and the display module 220 includes a back plate 221, and a diaphragm assembly 222 and a tempered glass 223 that are sequentially arranged on the side of the back plate 221 away from the rear shell 210. The diaphragm assembly 222 is an optical diaphragm commonly used in displays or conference machines, which will not be repeated herein.

Optionally, a reinforcement frame 240 is provided on the side of the back plate 221 close to the rear shell 210. The rotating member 120 of the rotating device 100 is fixed on the reinforcement frame 240 by a screw. A through hole for the screw to pass through is opened at the corresponding position of the rear shell 210.

Thereinto, the reinforcement frame 240 includes two first reinforcement beams 241 arranged in parallel along the vertical direction, and two second reinforcement beams 242 connected between the two first reinforcement beams 241. The two second reinforcement beams 242 are parallel to each other, and the two second reinforcement beams. 242 are symmetrically arranged along the center line of the display module 220. The rotating member 120 is connected with the two second reinforcement beams 242 by screws, respectively. The I-shaped reinforcement frame 240 can greatly enhance the support strength of the information terminal 200, avoiding the following: the rotating device 100 is directly connected with the rear shell 210, and when the information terminal 200 with a larger size is fixed to the rotating device 100, the rear shell 210 is prone to be deformed.

The two first reinforcement beams 241 are respectively adjacent to the upper and lower ends of the display module 220, and the length of the first reinforcement beam 241 extends along the horizontal direction, and the two ends of the first reinforcement beam 241 are adjacent to the left and right sides of the display module 220.

The first reinforcement beam 241 includes a first beam body with a U-shaped cross section. The first beam body includes a first reinforcement plate 2411, a second reinforcement plate 2412, and a third reinforcement plate 2413 that are sequentially connected vertically. The second reinforcement plate 2412 is parallel to the back plate 221. Fourth reinforcement plates 2414 are provided by make the end of the first reinforcement plate 2411 away from the second reinforcement plate 2412 and the end of the third reinforcement plate 2413 away from the second reinforcement plate 2412 respectively extend toward the outside of the first beam body. The fourth reinforcement plates 2414 are parallel to the back plate 221 and are detachably connected with the back plate 221 by screws.

The second reinforcement beam 242 includes a second beam body with a U-shaped cross section. The second beam body includes a fifth reinforcement plate 2421, a sixth reinforcement plate 2422, and a seventh reinforcement plate 2423 that are sequentially connected vertically. The sixth reinforcement plate 2422 is parallel to the back plate 221. Eighth reinforcement plates 2424 are provided by making the end of the fifth reinforcement plate 2421 away from the sixth reinforcement plate 2422 and the end of the seventh reinforcement plate 2423 away from the sixth reinforcement plate 2422 respectively extend towards the outside of the second beam body. The eighth reinforcement plates 2424 are parallel to the back plate 221 and are detachably connected with the back plate 221 by screws.

The two ends of the second reinforcement beam 242 are respectively connected by a beam connecting block 243. The beam connecting block 243 includes a first plate member 2431, a second plate member 2432, and a third plate member 2433 that are vertically connected. The first plate member 2431 is connected with the second reinforcement plate 2412 of the first reinforcement beam 241 by a screw, and the third plate member 2433 is connected with the sixth reinforcement plate 2422 by a screw. By providing the beam connecting block 243, the first reinforcement beam 241 and the second reinforcement beam 242 can be located in the same plane in the vertical direction, which can reduce the occupying space in the thickness direction while ensuring that the reinforcement frame 240 has sufficient strength, thereby facilitating the information terminal 200 to realize a thin and light design.

In one embodiment, the back plate 221 is formed by pressing aluminum plate. The aluminum plate can accelerate the heat dissipation. The back plate 221 is provided with more control modules that generate more heat. Therefore, the back plate 221 made of aluminum plate can accelerate the heat dissipation of the information terminal 200. At the same time, the pressed aluminum plate has a higher flatness after being formed, thereby facilitating the installation of various electronic devices, which can also reduce installation errors.

In one embodiment, as shown in FIGS. 26 to 29, a fixing structure for fixing the diaphragm assembly 222 is provided on the side of the back plate 221 deviating from the rear shell 210. The fixing structure includes a plurality of first positioning pillars 224 and a plurality of second positioning pillars 225. Both the first positioning pillars 224 and the second positioning pillars 225 are arranged on the side of the back plate 221 deviating from the rear shell 210. Both long sides of the back plate 221 are arranged with a plurality of first positioning pillars 224 at intervals, and both short sides of the back plate 221 are arranged with a plurality of second positioning pillars 225 at intervals. All the positioning pillars on the back plate 221 form one rectangular positioning surface. By providing positioning pillars on the four sides of the back plate 221, it can be convenient for the information terminal 200 when rotating at any angle to support the diaphragm assembly 222, thereby preventing the diaphragm assembly 222 from deforming after rotation.

In this embodiment, a plurality of first positioning pillars 224 arranged on the long sides are arranged on the back plate 221 at equal intervals, and a plurality of second positioning pillars 225 arranged on the short sides are arranged on the back plate 221 at equal intervals.

Optionally, the cross section of the second positioning pillar 225 is bar or oval, that is, the width of the second positioning pillar 225 is greater than the thickness, and the width direction of the second positioning pillar 225 extends along the length direction of the short side of the back plate 221. The information terminal 200 is rectangular. When rotating, the information terminal 200 is erected (that is, when the short side of the information terminal 200 is parallel to the horizontal plane), the second positioning pillar 225 will bear a relatively large force. Therefore, the second positioning pillar 225 is arranged to have a cross section in a bar shape or an oval shape, which can increase the contact area of the second positioning pillar 225 and the diaphragm assembly 222, and improve the support strength, thereby effectively preventing the diaphragm assembly 222 from deforming after the rotation. Meanwhile, the positioning pillars arranged around the back plate 221 can ensure that the information terminal 200 rotating to any angle can effectively support the diaphragm assembly 222, and prevent the diaphragm assembly 222 from being deformed.

The diaphragm assembly 222 is opened with a first positioning hole and a second positioning hole for being plugged by the first positioning pillar 224 and the second positioning pillar 225, wherein the shape of the first positioning hole matches the shape of the first positioning pillar 224, and the shape of the second positioning hole matches the shape of the second positioning pillar 225.

The cross section of the first positioning pillar 224 is circular, and the first positioning hole is a circular hole.

In other embodiments, the distance between two adjacent second positioning pillars 225 is smaller than the distance between two adjacent first positioning pillars 224. This design can also enhance the support for the diaphragm assembly 222 to a certain extent, and prevent the diaphragm assembly 222 from being deformed.

Figure 17:
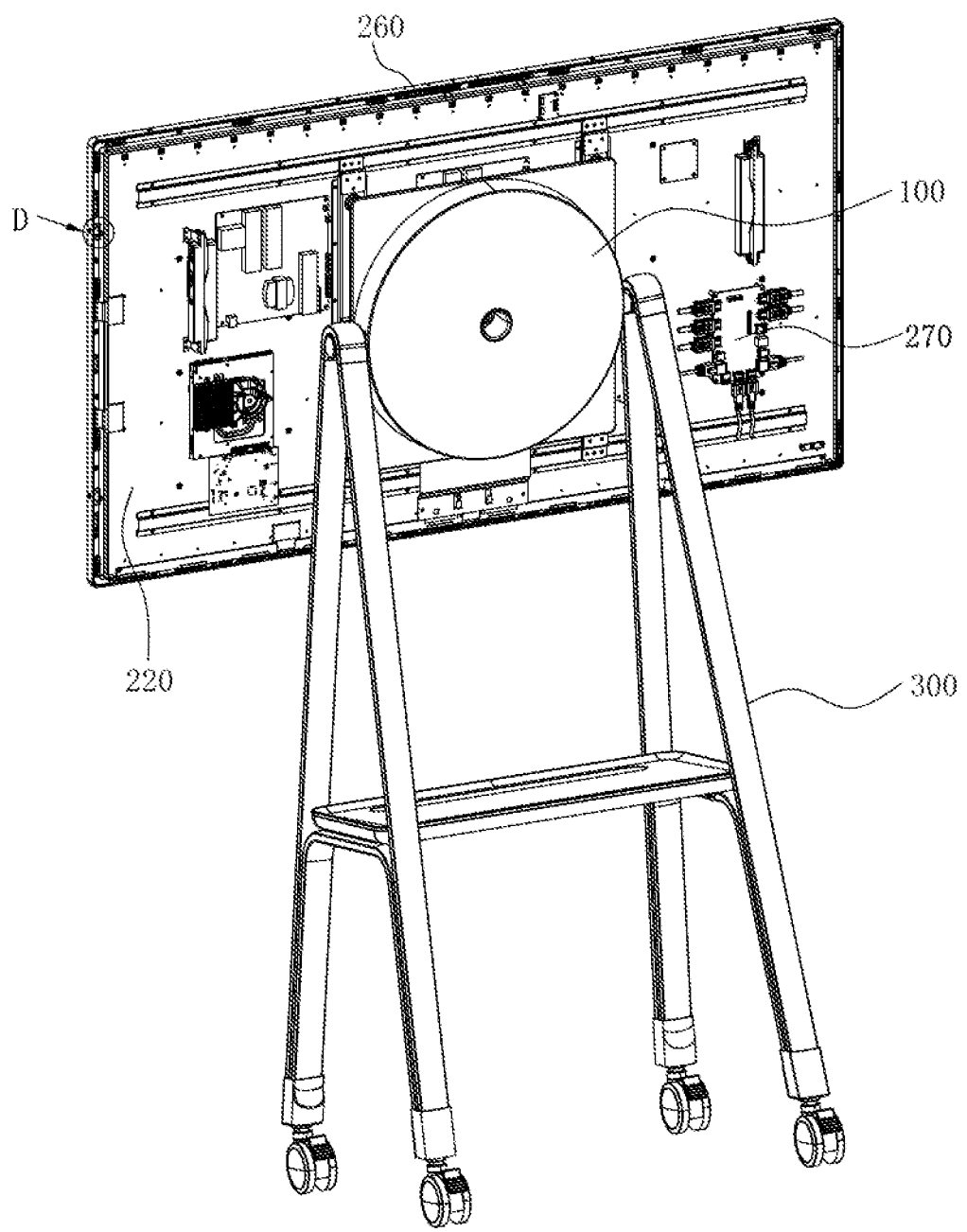
FIG. 17 is a three-dimensional schematic diagram (the rear shell is not shown) of an interactive information terminal with variable form according to the embodiment of the present application.
Figure 18:
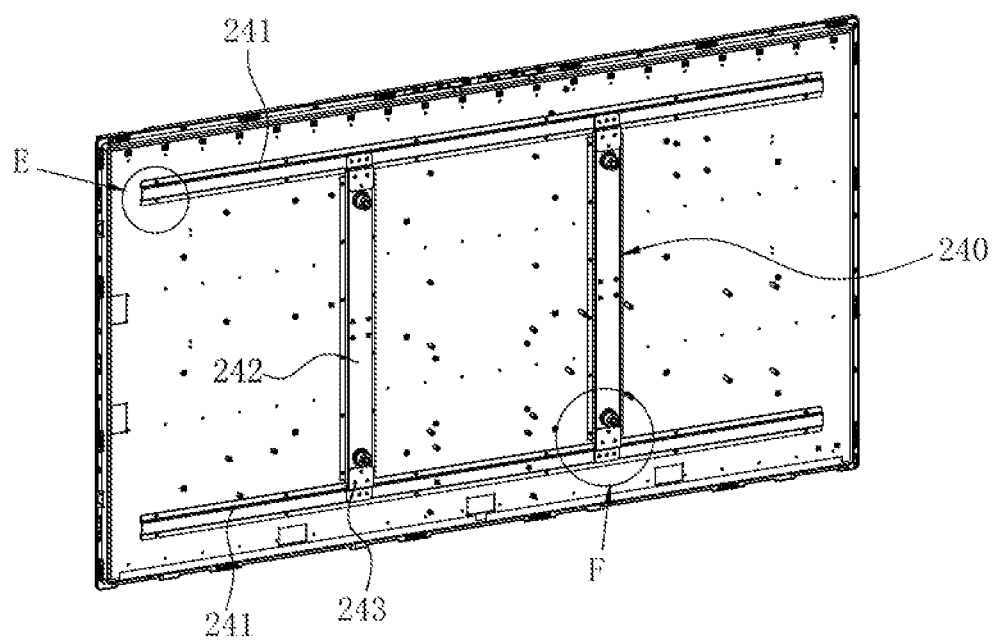
FIG. 18 is a three-dimensional schematic diagram (the rear shell is not shown) of an information terminal according to the embodiment of the present application.
Figure 19:
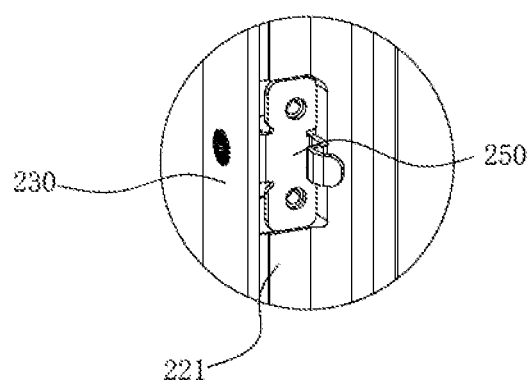
FIG. 19 is an enlarged schematic diagram of D of FIG. 17.
Figure 20:
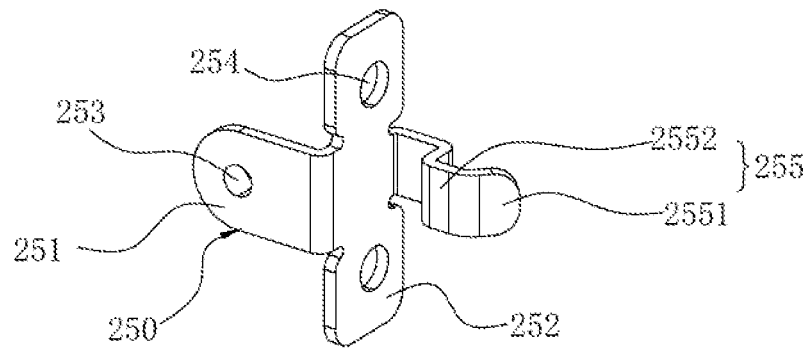
FIG. 20 is a three-dimensional schematic diagram of an adapter plate according to the embodiment of the present application.
Figure 21:
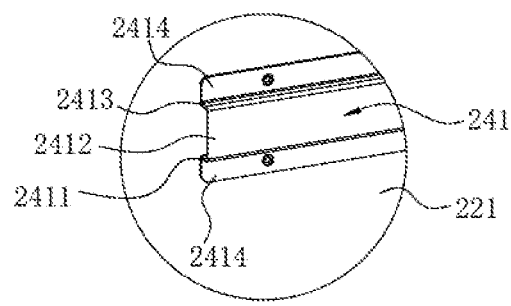
FIG. 21 is an enlarged schematic diagram of E in FIG. 18.
Figure 22:
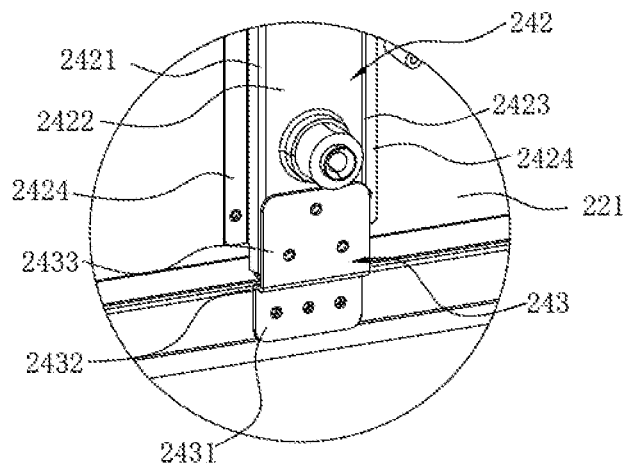
FIG. 22 is an enlarged schematic diagram of F FIG. 18.

In one embodiment, as shown in FIGS. 17, 19 and 20, the frame 230 and the back plate 221 are connected by an adapter plate 250. The adapter plate 250 includes a first adapter plate 251 and a second adapter plate 252. Thereinto, the first adapter plate 251 is arranged between the frame 230 and the side edge of the back plate 221. The first adapter plate 251 is opened with a first through hole 253. The second adapter plate 252 is perpendicular to the first adapter plate 251. The second adapter plate 252 is located between the back plate 221 and the rear shell 210. The second adapter plate 252 is opened with a second through hole 254. The side edge of the frame 230 is opened with a third through hole. The side edge of the back plate 221 is opened with a first threaded hole. A first screw passes through the third through hole and the first through hole 253, and is screwed into the first threaded hole, so as to connect the frame 230 with the back plate 221. The back plate 221 is opened with a second threaded hole corresponding to the second through hole 254. A second screw passes through the second through hole 254, and is screwed into the second threaded hole, so as to fix the adapter plate 250 to the back plate 221. By providing the adapter plate 250, it can be realized that the frame 230 is connected with the back plate 221 by locking screws on the side edge of the frame 230, and the frame 230 can be fixed even if the width of the frame 230 extending toward the inside of the information terminal 200 is narrow. In addition, the manner of locking screws on the side edge can also facilitate the information terminal 200 to realize a thin and light design.

The adapter plate 250 further includes an elastic sheet 255 connected with the second adapter plate 252, and the elastic piece 255 can elastically abut against the side of the rear shell 210 close to the back plate 221, so as to fix the rear shell 210 on the back plate 221. The elastic sheet 255 includes an elastic sheet body 2551 and an abutting portion 2552 convexly provided on the side of the elastic sheet body 2551 facing away from the center of the information terminal 200. The rear shell 210 includes a shell body 212 and a periphery edge 213 annularly provided on the periphery portion of the shell body 212. When the rear shell 210 is installed on the back plate 221, the abutting portion 2552 of the elastic sheet 255 on the adapter plate 250 abuts against the periphery edge 213. At this time, the elastic sheet 255 is in a squeezed state. When the rear shell 210 needs to be removed, it is only necessary to apply an external force to overcome the elastic force of the elastic sheet 255, so that the abutting portion 2552 of the elastic sheet 255 can be separated from the periphery edge 213, and the rear shell 210 can be disassembled.

At least one adapter plate 250 is provided on each side surface of the periphery portion of the information terminal 200. Optionally, each side surface of the periphery portion of the information terminal 200 is provided with a plurality of adapter plates 250.

Figure 23:
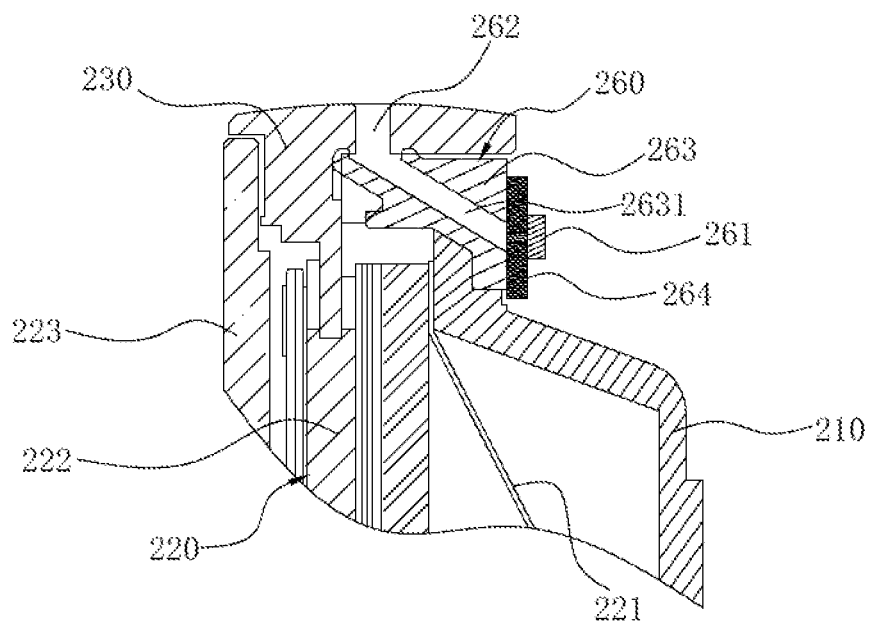
FIG. 23 is a schematic partial cross sectional view of an information terminal according to the embodiment of the present application.
Figure 24:
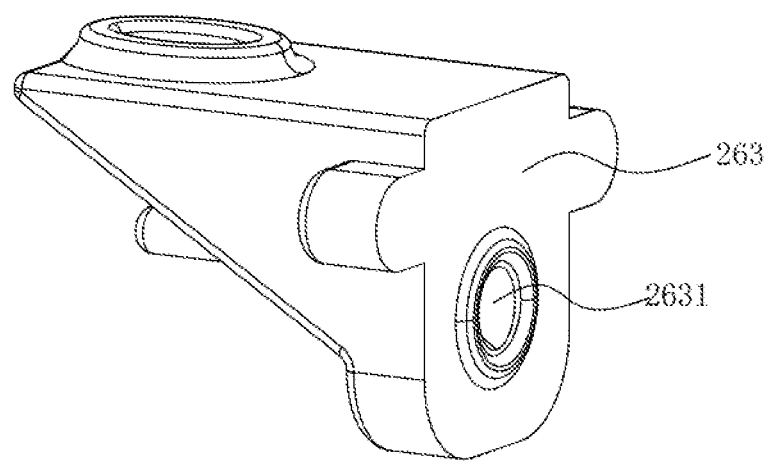
FIG. 24 is a three-dimensional schematic diagram of a sound guide member according to the embodiment of the present application.
Figure 25:
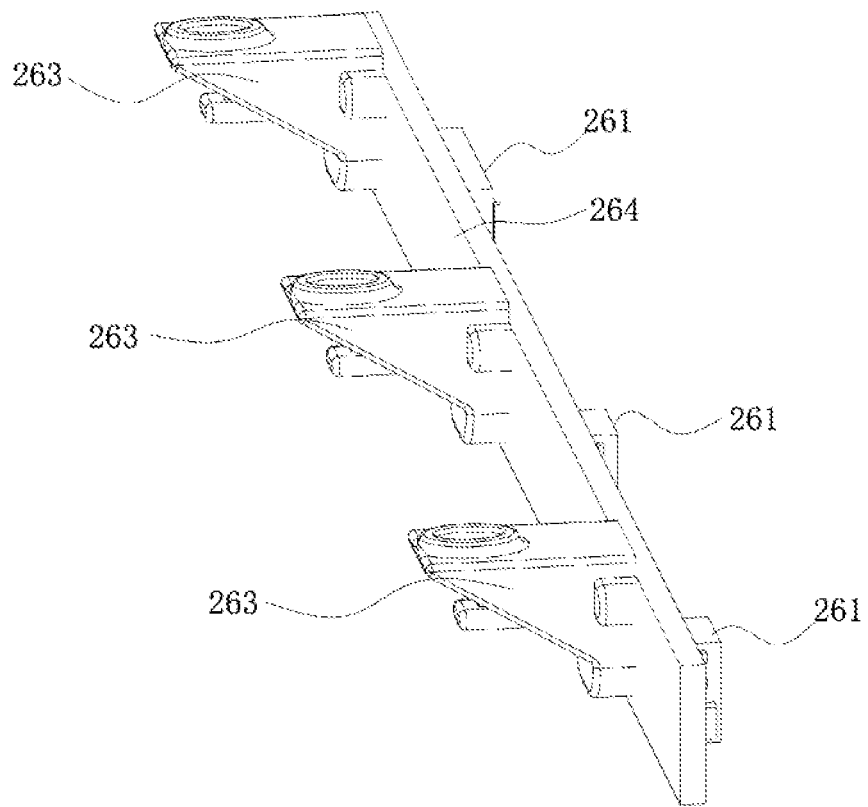
FIG. 25 is a diagram of the installation state of the sound guide member according to the embodiment of the present application.
Figure 26:
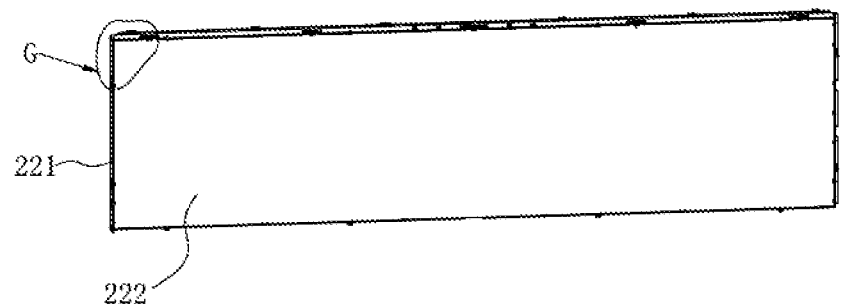
FIG. 26 is a schematic diagram of assembling a back plate and a diaphragm assembly according to the embodiment of the present application.
Figure 27:
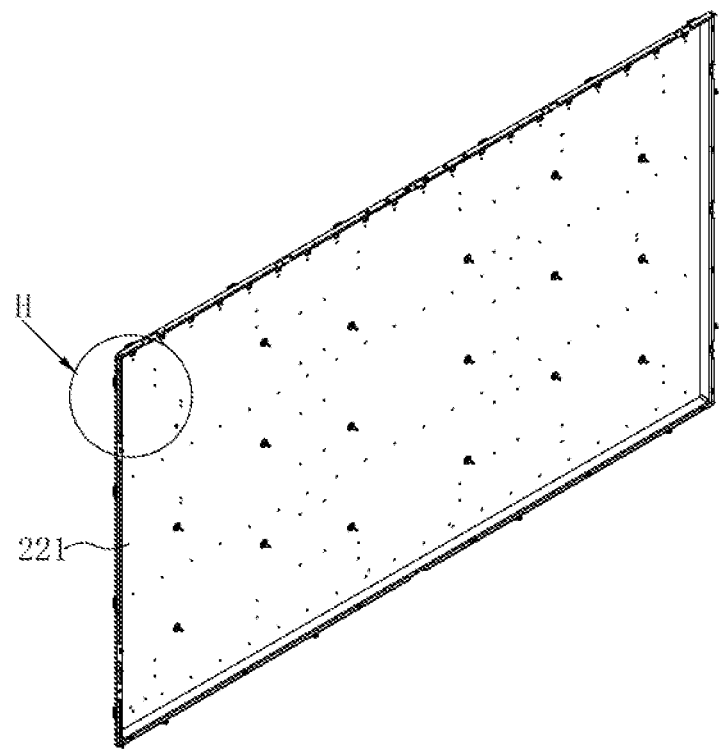
FIG. 27 is a schematic structure diagram of a back plate according to the embodiment of the present application.
Figure 28:
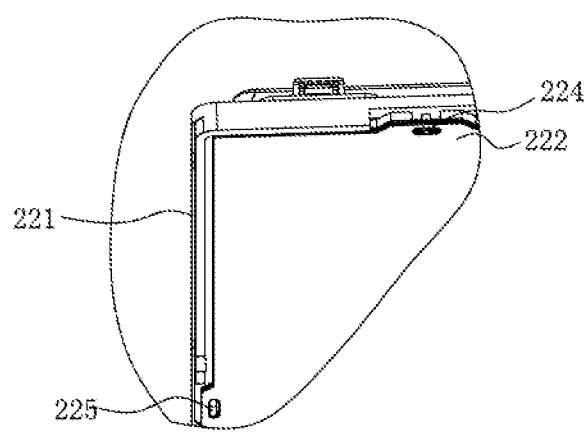
FIG. 28 is an enlarged schematic diagram of G in FIG. 26.
Figure 29:
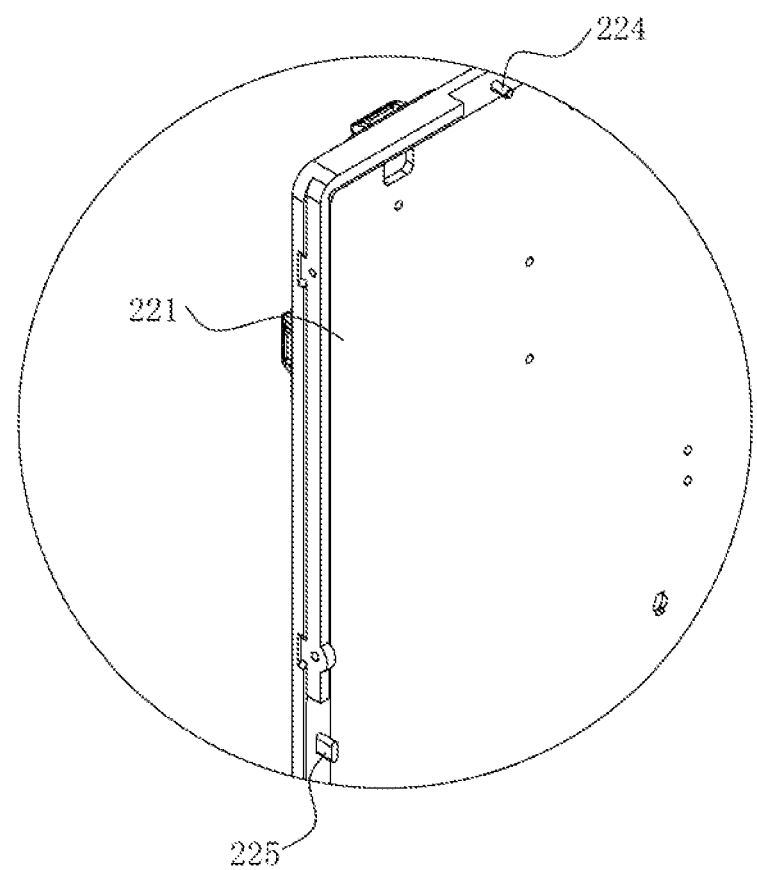
FIG. 29 is an enlarged schematic diagram of H in FIG. 27.
In the figures,
100. Rotating device,
110. Fixing member, 111. First body, 112. First convex portion, 113. First accommodating slot, 114. First rotating shaft hole, 115. Protrusion, 1151. First plate, 1152. Second plate, 1153. Elastic: sheet structure,
120. Rotating member 121. Second body, 122. First groove; 123. Protruding pillar, 124. Second convex portion, 125. Second accommodating slot, 126. Second rotating shaft hole, 127. Hook.
130. Rotating shaft, 131. Shaft body, 132. End plate, 133. Wire through hole, 134. Limit nut,
140. Connecting assembly, 141. Connecting member, 1411. Third body, 1412. Plug board, 142. Adapter member, 1421. Plug slot, 1422. Fourth body, 1423. Connecting pillar, 14231. Limit plane, 14232. Arc-shaped connecting surface,
150. Limit assembly; 151. Limit pin, 152. First limit slot, 153. Second limit slot,
160. Wear-resistant plate, 161. Third rotating shaft hole,
170. Wear-resistant gasket,
180. Rear cover, 181. Fourth body, 182. Shielding side, 183. Position leaving slot, 184. Fixing pillar,
190. Damping adjustment assembly, 191. Adjustment seat, 1911. First seat plate, 1912. Second seat plate, 192. Adjustment screw, 193. Damping sheet,
200. Information terminal,
210. Rear shell, 211. Matching slot, 212. Shell body, 213. Periphery edge, 214. Power socket, 220. Display module, 221. Back plate, 222. Diaphragm assembly, 223. Tempered glass, 224. First positioning pillar, 225. Second positioning pillar, 230. Frame, 240. Reinforcement frame, 241. First reinforcement beam, 2411. First reinforcement plate, 2412. Second reinforcement plate, 2413. Third reinforcement plate, 2414. Fourth reinforcement plate, 2421. Second reinforcement beam, 2421. Fifth reinforcement plate, 2422. Sixth reinforcement plate, 2423. Seventh reinforcement plate, 2424. Eighth reinforcement plate, 243. Beam connecting block, 2431. First plate member, 2432. Second plate member, 2433. Third plate member, 250. Adapter board, 251. First adapter plate, 252. Second adapter plate, 253. First through hole, 254. Second through hole, 255. Elastic sheet, 2551. Elastic sheet body, 2552. Abutment portion, 260. Microphone assembly, 261. Microphone, 262. Sound inlet, 263. Sound guide member, 2631. Sound guide hole, 264. Microphone circuit board, 270. Processing device,
300. Bracket,
310. Mounting seat, 320. Outrigger, 321. First rod body, 322. Second rod body, 323. Connecting rod body, 330. Wheel, 340. Reinforcement plate.

In one embodiment, as shown in FIGS. 23 to 25, a microphone assembly 260 is provided on the top portion of the information terminal 200. The microphone assembly 260 includes a microphone 261 and a sound inlet 262. The sound inlet 262 is opened on the frame 230 of the information terminal 200. The microphone 261 is installed on the microphone circuit board 264 between the display module 220 and the rear shell 210. A sound guide member 263 is provided between the sound inlet 262 and the microphone 261. The sound guide member 263 is opened with a sound guide hole 2631 which is connected with the sound inlet 262 and the microphone 261. By providing the sound guide member 263, the sound can be introduced from the sound inlet 262 to the microphone. This design no longer requires the microphone 261 and the sound inlet 262 to be directly opposite to each other, which makes it easier to realize the thin and light design of the smart interaction tablet.

Optionally, the sound inlet 262 is opened on the frame 230 and located on the front surface of the information terminal 200, or the sound inlet 262 is located on the side surface of the frame 230 connecting the front surface and the back surface of the information terminal 200.

The frame 230 includes an upper frame on the top of the information terminal 200, a lower frame on the bottom of the information terminal 200, a left frame on the left side of the information terminal 200, and a right frame on the right side of the information terminal 200. The sound inlet 262 can be opened in any one, or two or more of the upper frame, the lower frame, the left frame and the right frame.

In this embodiment, the sound inlet 262 is opened on the upper frame and is located on the side surface of the upper frame connecting the front surface and the back surface of the information terminal 200. Along the vertical direction, the sound inlet 262 is located above the microphone 261, and the sound guide hole 2631 is obliquely arranged, and the sound guide hole 2631 is inclined downward from the front surface to the back surface of the information terminal 200.

In other embodiments, the sound inlet 262 can also be opened on the lower frame. At this time, along the vertical direction, the sound inlet 262 is located below the microphone 261. Or, the sound inlet 262 is opened on the left frame, and at this time, along the horizontal direction, the sound inlets 262 are arranged on the left side of the microphone 261 at intervals. Or, the sound inlets 262 are arranged on the right frame, and at this time, along the horizontal direction, the sound inlets 262 are arranged on the right side of the microphone 261 at intervals.

In one embodiment, the diaphragm assembly 222 includes a touch layer. The wires of the touch layer are connected with a touch circuit board. The touch circuit board is arranged in any one of the upper frame, the lower frame, the left frame, and the right frame of the information terminal 200. By concentrating the lines of the touch layer on a touch circuit board, the touch circuit board is placed in any frame, so that the centralized wiring can be realized and the circuit design can be optimized.

In this embodiment, the touch circuit board is arranged in the lower frame of the information terminal 200.

In one embodiment, a processing device 270 is provided in the information terminal 200, and at least one interaction processing system is provided in the processing device 270.

In this embodiment, two interaction processing systems are provided in the processing device 270. The two interaction processing systems may both be Android systems, or one may be Android system and the other may be other processing system such as WINDOWS system.

In the embodiment of dual system, at least one of the systems is configured on the processing device 270 in the manner of a pluggable module.

In the embodiment of dual system, both systems are configured on the processing device 270 in a "non-pluggable" manner.

In other embodiments, the processing device 270 is also integrated with an OPS module (not shown in the figure). The OPS (fully referred as to: Open Pluggable Specification) module is an open pluggable computer module, which actually is also a microcomputer, and can be plugged and unplugged to make the overall layout beautiful.

In other embodiments, the OPS module can also be arranged detachably from the processing device 270, and the OPS module can be detachably connected with the information terminal 200.

The information terminal 200 is provided with a plug interface. The plug interface is connected with the outside of the information terminal 200 and electrically connected with the processing device 270 in the information terminal 200. The data plug on the OPS module can be selectively inserted into this plug interface, so as to enable the OPS module to electrically connect with the processing device 270.

Optionally, a module installation slot is opened on the information terminal 200, and this plug interface is provided in the module installation slot. The OPS module can be installed into the module installation slot by pulling. When the OPS module is installed in place, the data plug of the OPS module is plugged into and electrically connected with the plug interface.

In addition, the slot opening of the module installation slot can also be provided with a cover plate, and the cover plate can be fixed with screws to block the slot opening of the module installation slot, or fixed to the slot opening of the module installation slot by a buckle, or hinged to the slot opening of this module mounting slot by a rotating shaft.

Definitely, the OPS module can also be directly fixed in the module installation slot through a buckle assembly or a screw.

In the description of the present disclosure, it should be understood that the terms "upper", "lower", "right" and other orientations or positional relationships are based on the orientations or positional relationships shown in the drawings, and are only for ease of description and simplified operations, which do not indicate or imply that the pointed device or element must have a specific: orientation, be constructed and operated in a specific orientation, and therefore cannot be understood as a limitation of the present application. In addition, the terms "first", "second", and "third" are only used for distinguishing in description and have no special meaning.

In the explanation of this description, the description with reference to the terms "an embodiment", "example", etc. means that the concrete feature, structure, material or characteristic described in conjunction with the embodiment or example is included in at least one embodiment or example of the present application. In this description, the schematic representation of the above-mentioned terms does not necessarily refer to the same embodiment or example.

In addition, it should be understood that although this description is described in accordance with the implementation approaches, not each implementation approach only include an independent technical solution. This narration approach in the description is only for clarity of the device, and those skilled in the art should regard the description as a whole. The technical solutions in the various embodiments can also be appropriately combined to form other implementation approaches that can be understood by those skilled in the art.

What is claimed is:

1. An interactive information terminal with variable form, comprising:
   an information terminal, a rotating device, and a bracket,
   wherein the information terminal is fixed on the bracket by the rotating device, the rotating device includes a fixing member, a rotating member, and a rotating shaft, the fixing member is detachably connected with the information terminal, the rotating member is detachably connected with the bracket, and the rotating member is rotatably connected with the fixing member through the rotating shaft, so as to realize that the rotating member rotates around an axial line of the rotating shaft,
   the fixing member includes a first body having a circular shape, and at least one protrusion is provided on an outer periphery of the first body;
   the rotating member includes a second body, and at least a first groove for being plugged by and matched with the protrusion is provided, correspondingly to a rotation start point and a rotation end point of the information terminal, on the second body;
   wherein the protrusion includes a first plate and a second plate that are vertically connected, the first plate is detachably connected with a side of the fixing member deviating from the rotating member by a screw, the second plate is arranged on a side of the first plate close to the rotating member, an elastic sheet structure is convexly provided on a side of the second plate facing away from a center of the fixing member.

2. The interactive information terminal with variable form according to claim 1, wherein four protrusions are uniformly distributed on a periphery portion of the first body, and four first grooves are provided on the second body.

3. The interactive information terminal with variable form according to claim 1, wherein two protruding pillars are provided on the second body at intervals, and the first groove is formed between the two protruding pillars.

4. The interactive information terminal with variable form according to claim 1, wherein a bump is provided on the rotating member, and the first groove is concavely formed on a side surface of the bump close to the fixing member.

5. The interactive information terminal with variable form according to claim 1, wherein a ring plate is annularly protruded on the rotating member, and the first groove is concavely arranged on an inner wall of the ring plate.

6. The interactive information terminal with variable form according to claim 3, wherein a second convex portion is convexly provided at a center of the second body facing the fixing member, a cross section of the second convex portion is circular, an outer peripheral wall of the second convex portion and the protruding pillar are provided at intervals so as to form a space for the second plate to pass through, a distance between the outer peripheral wall of the second convex portion and the protruding pillar is greater than a thickness of the second plate, and the distance between the outer peripheral wall of the second convex portion and the protruding pillar is smaller than a height of the elastic sheet structure protruding from the second plate.

7. The interactive information terminal with variable form according to claim 1, wherein the rotating device further includes a limit assembly, and the limit assembly is used to limit an angle at which the rotating member can rotate relative to the fixing member, the limit assembly includes a limit pin and an arc-shaped limit slot, an arc-shaped center of the limit slot is concentric with an axial center of the rotating shaft, one of the limit pin and the limit slot is arranged on the fixing member, and the other of the limit pin and the limit slot is arranged on the rotating member.

8. The interactive information terminal with variable form according to claim 7, wherein an arc-shape angle of the limit slot is 90 degrees.

9. The interactive information terminal with variable form according to claim 7, wherein the limit slot includes two first limit slots and two second limit slots, the two first limit slots are symmetrically located on a first circumference with the axial center of the rotating shaft as a center, the two second limit slots are symmetrically located on a second circumference with the axial center of the rotating shaft as a center, and a diameter of the first circumference is not equal to that of the second circumference.

10. The interactive information terminal with variable form according to claim 7, wherein a center connecting line of the two first limit slots is a first connecting line, a center connecting line of the two second limit slots is a second connecting line, the first connecting line and the second connecting line are perpendicular and intersecting, an intersection point of the first connecting line and the second connecting line coincides with an axial center of the rotating shaft, and the two first limit slots and the two second limit slots are distributed along the four directions of 0°, 90°, 180° and 270° with the axial center of the rotating shaft as a center of a circle.

11. The interactive information terminal with variable form according to claim 1, wherein a wire through hole is penetrated through the rotating shaft.

12. The interactive information terminal with variable form according to claim 1, wherein
the fixing member is connected with the bracket through a connecting assembly;
the connecting assembly includes a connecting member and an adapter member detachably arranged at two opposite ends of the connecting member, and an end of the adapter member away from the connecting member is detachably connected with the bracket.

13. The interactive information terminal with variable form according to claim 12, wherein the connecting member includes a plate-shaped third body, the third body is fixed on the fixing member by a screw, the third body is extended with a plug board, a plug slot is opened on the adapter member, and the plug board is inserted into the plug slot and then fixed in the plug slot by a screw.

14. The interactive information terminal with variable form according to claim 13, wherein the adapter member includes a fourth body, and the plug slot is opened on the side of the fourth body, the plug slot has a first slot opening deviating from the fixing member and a second slot opening facing the third body of the connecting member, the plug board of the connecting member is inserted into the plug slot via the second slot opening, and the screw is screwed into the plug slot through the first slot opening, so as to fix the plug board in the plug slot.

15. The interactive information terminal with variable form according to claim 1, wherein the rotating device further includes a damping adjustment assembly, the damping adjustment assembly includes an adjustment seat, an adjustment screw, and a damping sheet, the adjustment screw is screwed on the adjustment seat, the damping sheet is connected with an end portion of the adjustment screw and selectively abuts against a side of the fixing member deviating from the rotating member.

16. The interactive information terminal with variable form according to claim 1, wherein the information terminal comprises a display module and a rear shell arranged on a rear side of the display module, the display module includes a back plate, and a diaphragm assembly and a tempered glass that are sequentially arranged on a side of the back plate away from the rear shell, a reinforcement frame is provided on a side of the back plate close to the rear shell, the rotating member is fixed on the reinforcement frame by a screw, and a through hole for the screw to pass through is opened at a corresponding position of the rear shell.

17. The interactive information terminal with variable form according to claim 16, wherein the information terminal further comprises a frame wrapped on a periphery portion of the display module, the frame and the back plate are connected by an adapter plate, the adapter plate includes a first adapter plate and a second adapter plate, wherein the first adapter plate is arranged between the frame and a side edge of the back plate, and is connected with the frame and a side edge of the back plate by a screw, the second adapter plate is perpendicular to the first adapter plate, and the second adapter plate is located between the back plate and the rear shell and is connected with the back plate by a screw.

18. The interactive information terminal with variable form according to claim 17, wherein the adapter plate further includes an elastic sheet connected to the second adapter plate, and the elastic sheet can elastically abut against a side of the rear shell close to the back plate, so as to fix the rear shell on the back plate.

\* \* \* \* \*

UNITED STATES PATENT AND TRADEMARK OFFICE
CERTIFICATE OF CORRECTION

| | |
|---|---|
| PATENT NO. | : 11,950,381 B2 |
| APPLICATION NO. | : 17/383673 |
| DATED | : April 2, 2024 |
| INVENTOR(S) | : Kesong Zhou and Zhicheng Peng |

It is certified that error appears in the above-identified patent and that said Letters Patent is hereby corrected as shown below:

On the Title Page

Item (71) Applicants: GUANGZHOU SHIRUI ELECTRONICS CO., LTD, Guangdong (CN)
GUANGZHOU SHIYUAN ELECTRONICS CO., LTD., Guangdong (CN)

Should be amended to read:
(71) Applicants: GUANGZHOU SHIRUI ELECTRONICS CO., LTD, Guangdong (CN)
GUANGZHOU SHIYUAN ELECTRONIC TECHNOLOGY COMPANY LIMITED, Guangdong (CN)

Signed and Sealed this
Fifth Day of November, 2024

Katherine Kelly Vidal
*Director of the United States Patent and Trademark Office*